(12) United States Patent
Sasaki

(10) Patent No.: US 9,627,404 B2
(45) Date of Patent: Apr. 18, 2017

(54) METHOD FOR MANUFACTURING SEMICONDUCTOR DEVICE

(71) Applicant: KABUSHIKI KAISHA TOSHIBA, Tokyo (JP)

(72) Inventor: Toshiyuki Sasaki, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/996,820

(22) Filed: Jan. 15, 2016

(65) Prior Publication Data

US 2017/0062458 A1    Mar. 2, 2017

Related U.S. Application Data

(60) Provisional application No. 62/212,937, filed on Sep. 1, 2015.

(51) Int. Cl.
| | |
|---|---|
| *H01L 27/11582* | (2017.01) |
| *H01L 21/311* | (2006.01) |
| *H01L 21/28* | (2006.01) |
| *H01L 21/768* | (2006.01) |

(52) U.S. Cl.
CPC .. *H01L 27/11582* (2013.01); *H01L 21/28282* (2013.01); *H01L 21/31116* (2013.01); *H01L 21/7682* (2013.01)

(58) Field of Classification Search
CPC .......... H01L 21/28273; H01L 21/8239; H01L 21/115; H01L 27/11582; H01L 21/28282; H01L 21/31116; H01L 21/7682
See application file for complete search history.

(56) References Cited

U.S. PATENT DOCUMENTS

| | | | |
|---|---|---|---|
| 8,273,628 B2 | 9/2012 | Yahashi | |
| 8,334,212 B2 | 12/2012 | Sasaki | |
| 8,441,061 B2 | 5/2013 | Nakao et al. | |
| 8,900,984 B2 | 12/2014 | Nakao et al. | |
| 2010/0203738 A1 | 8/2010 | Sasaki | |
| 2011/0049607 A1 | 3/2011 | Yahashi | |
| 2011/0057249 A1 | 3/2011 | Nakao et al. | |
| 2011/0233648 A1 | 9/2011 | Seol et al. | |
| 2013/0237047 A1 | 9/2013 | Nakao et al. | |
| 2013/0334593 A1 | 12/2013 | Seol et al. | |
| 2014/0264533 A1* | 9/2014 | Simsek-Ege | ........ H01L 27/1158 257/316 |
| 2015/0311301 A1 | 10/2015 | Seol et al. | |

* cited by examiner

*Primary Examiner* — Thanh T Nguyen
(74) *Attorney, Agent, or Firm* — Finnegan, Henderson, Farabow, Garrett & Dunner LLP

(57) ABSTRACT

According to one embodiment, a method for manufacturing a semiconductor device includes exposing the first sacrificial film on the bottom by removing the second sacrificial film on the bottom. The method includes making a gap between the second sacrificial film and a side surface of the lower portion of the hole by causing etching of the first sacrificial film to progress along the side surface of the lower portion of the hole from the exposed portion on the bottom. The method includes causing an end of at least one portion of the lower layer portion of the etching layer to recede in a diametrical direction of the hole by causing side etching to progress from an end of the lower layer portion of the etching layer exposed in the gap.

18 Claims, 26 Drawing Sheets

METHOD FOR MANUFACTURING SEMICONDUCTOR DEVICE

CROSS-REFERENCE TO RELATED APPLICATION

This application is based upon and claims the benefit of priority from U.S. Provisional Patent Application 62/212,937, filed on Sep. 1, 2015; the entire contents of which are incorporated herein by reference.

FIELD

Embodiments described herein relate generally to a method for manufacturing a semiconductor device.

BACKGROUND

A memory device having a three-dimensional structure has been proposed. The memory device includes a stacked body in which a plurality of electrode layers that function as control gates of memory cells are stacked with insulating layers interposed between the electrode layers. Memory holes are made in the stacked body, and silicon bodies used to form channels are provided on the side surfaces of the memory holes with a charge storage film interposed between the silicon bodies and the side surfaces of the memory holes.

The memory hole is made by, for example, reactive ion etching (RIE). As the aspect ratio of the memory hole increases, the lower side surface of the memory hole made by RIE becomes tapered; and there is a tendency for the diameter to decrease toward the lower portion of the memory hole. The fluctuation of the diameter in the depth direction of the memory hole may cause fluctuation of the device characteristics between the upper layer side and the lower layer side.

SUMMARY

According to one embodiment, a method for manufacturing a semiconductor device includes forming a first sacrificial film on a side surface of a hole and on a bottom of the hole. The hole is made in an etching layer. A diameter of a lower portion of the hole made in a lower layer portion of the etching layer is smaller than a diameter of an upper portion of the hole made in an upper layer portion of the etching layer. The method includes forming a second sacrificial film to cover the first sacrificial film. The method includes exposing the first sacrificial film on the bottom by removing the second sacrificial film on the bottom. The method includes making a gap between the second sacrificial film and a side surface of the lower portion of the hole by causing etching of the first sacrificial film to progress along the side surface of the lower portion of the hole from the exposed portion on the bottom. The method includes causing an end of at least one portion of the lower layer portion of the etching layer to recede in a diametrical direction of the hole by causing side etching to progress from an end of the lower layer portion of the etching layer exposed in the gap. The first sacrificial film and the second sacrificial film are formed also on an upper surface of the etching layer. The first sacrificial film on the upper surface of the etching layer is covered with a cover film. The cover film includes the second sacrificial film. A thickness of the cover film is thicker than a thickness of the second sacrificial film on the bottom.

DETAILED DESCRIPTION

Figure 1:
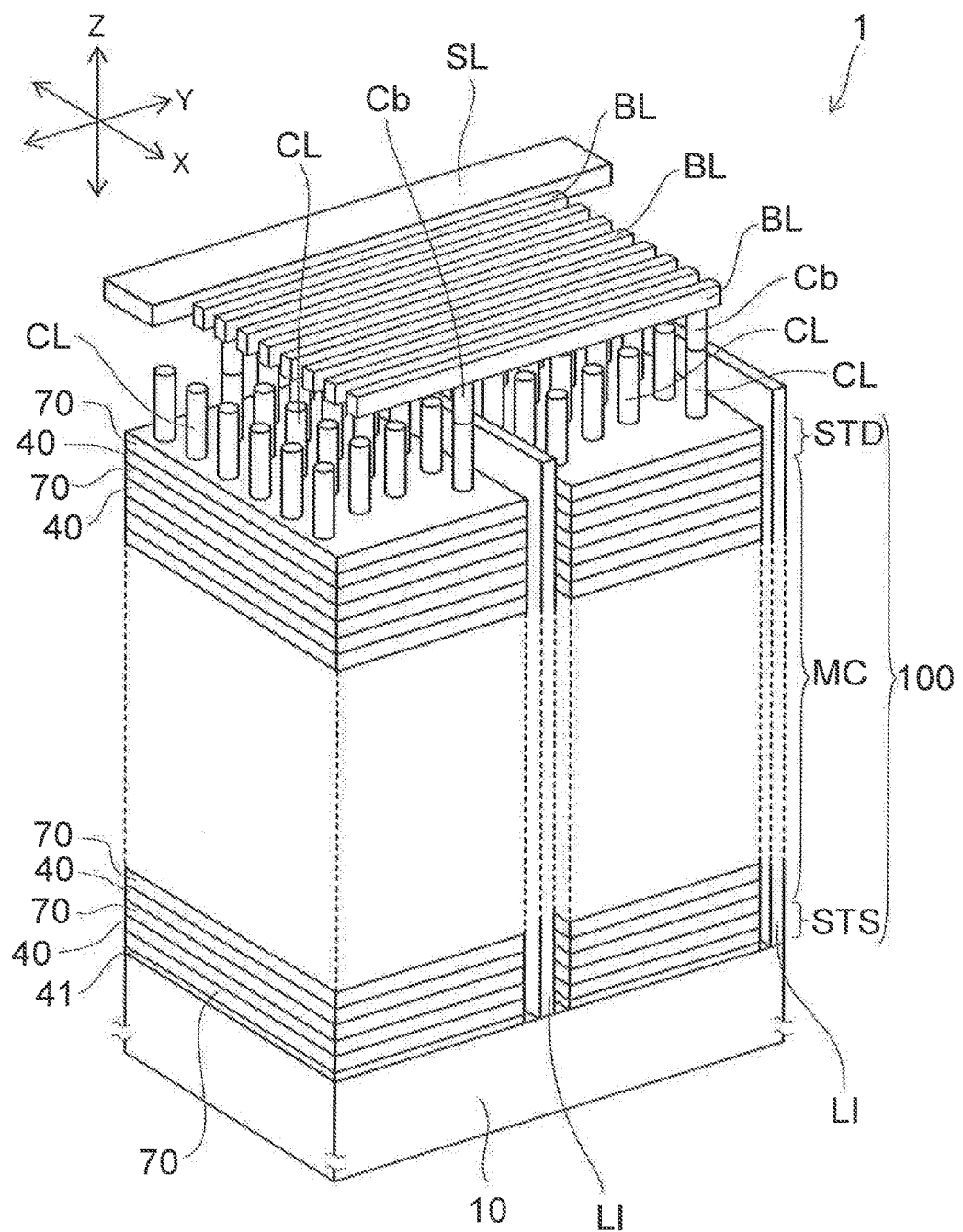
FIG. 1 is a schematic perspective view of a semiconductor device of an embodiment.

According to one embodiment, a method for manufacturing a semiconductor device includes forming a first sacrificial film on a side surface of a hole and on a bottom of the hole. The hole is made in an etching layer. A diameter of a lower portion of the hole made in a lower layer portion of the etching layer is smaller than a diameter of an upper portion of the hole made in an upper layer portion of the etching layer. The method includes forming a second sacrificial film to cover the first sacrificial film. The method includes exposing the first sacrificial film on the bottom by removing the second sacrificial film on the bottom. The method includes making a gap between the second sacrificial film and a side surface of the lower portion of the hole by causing etching of the first sacrificial film to progress along the side surface of the lower portion of the hole from the exposed portion on the bottom. The method includes causing an end of at least one portion of the lower layer portion of the etching layer to recede in a diametrical direction of the hole by causing side etching to progress from an end of the lower layer portion of the etching layer exposed in the gap.

Embodiments will now be described with reference to the drawings. The same components are marked with the same reference numerals in the drawings.

In the embodiment, for example, a semiconductor memory device that includes a memory cell array having a three-dimensional structure is described as a semiconductor device.

FIG. 1 is a schematic perspective view of the memory cell array 1 of the embodiment.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction).

As shown in FIG. 1, the memory cell array 1 includes the substrate 10, a stacked body 100 provided on the substrate 10, a plurality of columnar units CL, a plurality of interconnect units LI, and upper layer interconnects provided above the stacked body 100. In FIG. 1, for example, bit lines BL and a source line SL are shown as the upper layer interconnects.

The Interconnect units LI spread in the stacking direction (the Z-direction) and the X-direction between the substrate 10 and the upper layer interconnects, and divide the stacked body 100 in the Y-direction.

The columnar units CL are formed in circular columnar or elliptical columnar configurations extending in the stacking direction (the Z-direction) through the stacked body 100.

For example, the plurality of columnar units CL have a staggered arrangement. Or, the plurality of columnar units CL may have a square lattice arrangement along the X-direction and the Y-direction.

The plurality of bit lines BL are separated from each other in the X-direction; and each of the bit lines BL extends in the Y-direction.

The upper ends of semiconductor films 20 of the columnar units CL described below are connected to the bit lines BL via contact parts Cb. The plurality of columnar units CL, each of which is selected from each of blocks separated in the Y-direction by the interconnect units LI, are connected to one common bit line BL.

Figure 2:
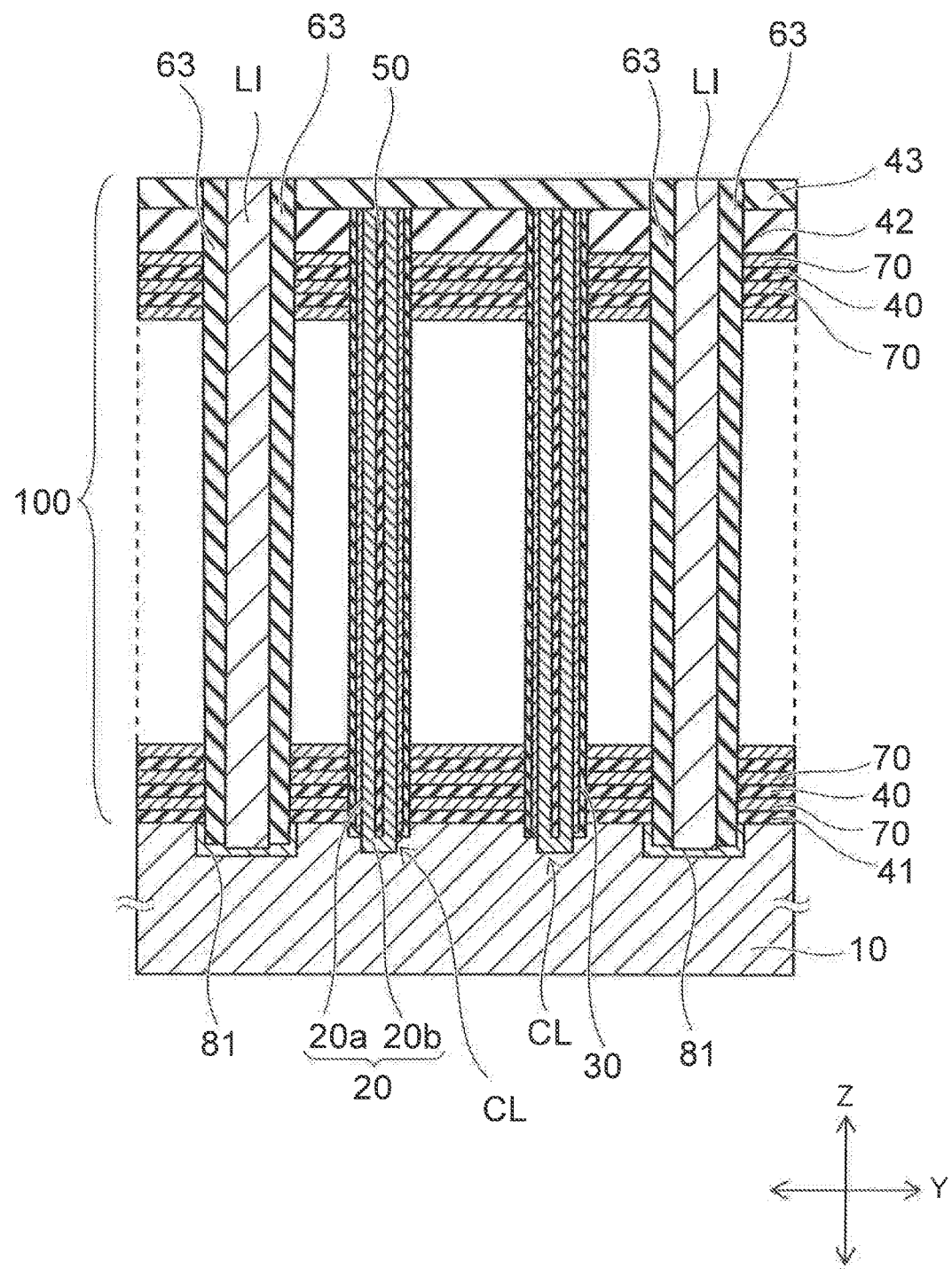
FIG. 2 is a schematic cross-sectional view of the semiconductor device of the embodiment.

FIG. 2 is a schematic cross-sectional view of the memory cell array 1. The Y-direction and the Z-direction shown in FIG. 2 correspond to the Y-direction and the Z-direction shown in FIG. 1.

Insulating films 42, 43, and 63 shown in FIG. 2 are not shown in FIG. 1.

The stacked body 100 is provided on the substrate 10. An insulating film 41 is provided on the front surface (a major surface) of the substrate 10; and a plurality of electrode layers 70 are stacked on the insulating film 41. The electrode layers 70 are stacked in a direction (the Z-direction) perpendicular to the major surface of the substrate 10 at a prescribed period with insulating layers 40 interposed between the electrode layers 70. One of the electrode layers 70 and one of the insulating layers 40 are stacked alternately.

The insulating layer 40 is provided between the electrode layer 70 and the electrode layer 70 adjacent in the stacking direction.

The insulating film 42 is provided on the electrode layer 70 of the uppermost layer; and the insulating film 43 is provided on the insulating film 42. The electrode layer 70 of the uppermost layer contacts the Insulating film 42.

The electrode layers 70 are, for example, metal layers containing tungsten or molybdenum. The insulating layers 40 are, for example, silicon oxide films.

The plurality of electrode layers 70 may be stacked with air gaps interposed as the insulating layers.

Figure 3:
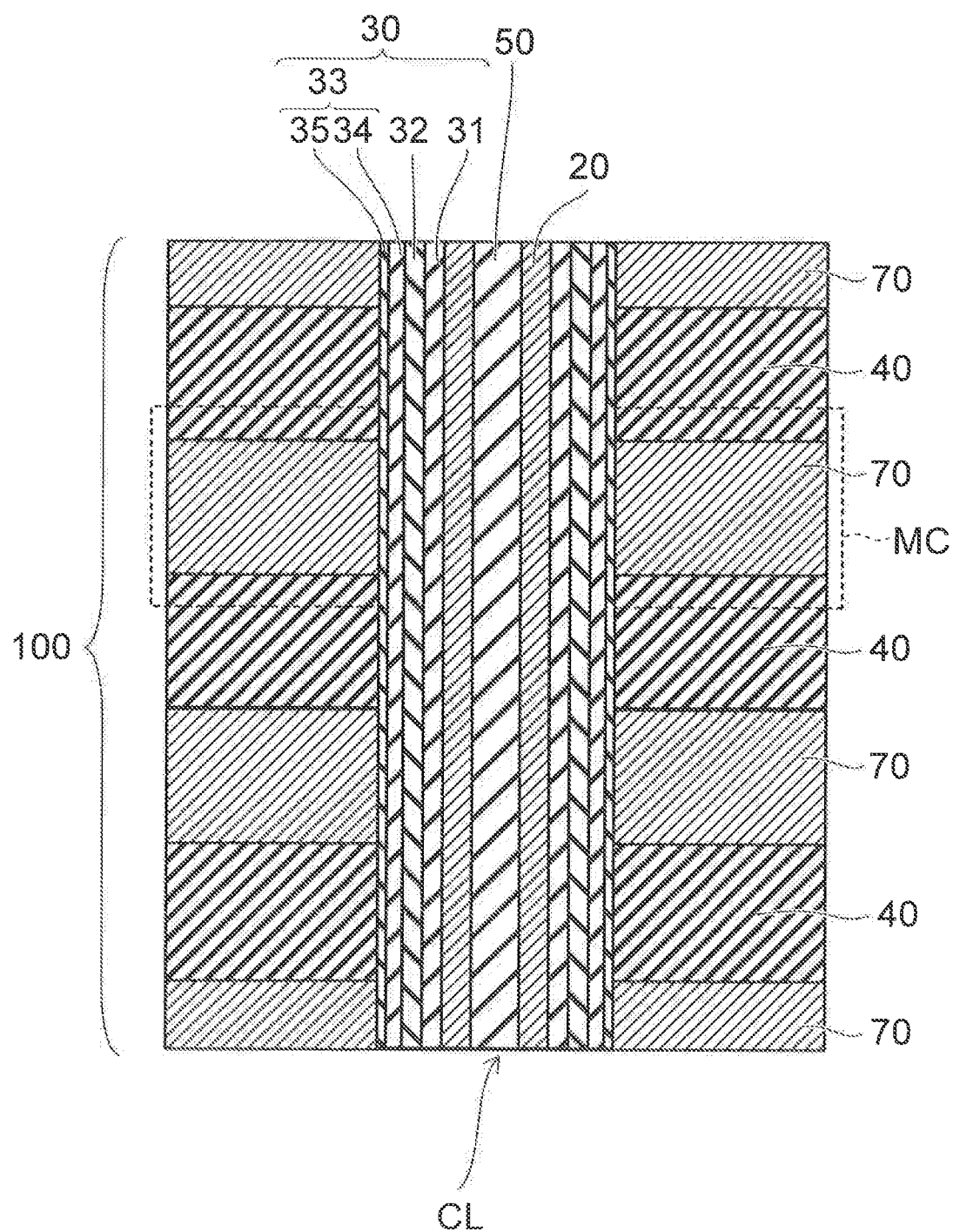
FIG. 3 is an enlarged schematic cross-sectional view of some of components of FIG. 2.

FIG. 3 is an enlarged schematic cross-sectional view of some of the components of FIG. 2.

The columnar unit CL is a stacked film including a memory film 30, the semiconductor film 20, and an insulative core film 50. The semiconductor film 20 extends in a pipe-like configuration in the stacking direction (the Z-direction) through the stacked body 100. The memory film 30 is provided between the semiconductor film 20 and the electrode layers 70 and is provided around the semiconductor film 20 from the outer circumferential side. The core film 50 is provided inside the semiconductor film 20 having the pipe-like configuration.

The upper end of the semiconductor film 20 is connected to the bit line BL via the contact part Cb shown in FIG. 1. The lower end of the semiconductor film 20 contacts the substrate as shown in FIG. 2.

The memory film 30 includes a tunneling insulating film 31, a charge storage film 32, and a blocking insulating film 33. The blocking insulating film 33, the charge storage film 32, the tunneling insulating film 31, and the semiconductor film 20 extend to be continuous in the stacking direction of the stacked body 100. The blocking insulating film 33, the charge storage film 32, and the tunneling insulating film 31 are provided between the semiconductor film 20 and the electrode layers 70 in order from the electrode layer 70 side. The tunneling insulating film 31 contacts the semiconductor film 20. The blocking insulating film 33 contacts the electrode layers 70. The charge storage film 32 is provided between the blocking insulating film 33 and the tunneling insulating film 31.

The semiconductor film 20, the memory film 30, and the electrode layers 70 are included in memory cells MC. One memory cell MC is illustrated schematically by broken lines in FIG. 3. The memory cell MC has a vertical transistor structure in which the electrode layer 70 is provided around the periphery of the semiconductor film 20 with the memory film 30 interposed.

In the memory cell MC having the vertical transistor structure, the semiconductor film 20 functions as a channel; and the electrode layer 70 functions as a control gate. The charge storage film 32 functions as a data storage layer that stores charge injected from the semiconductor film 20.

The semiconductor memory device of the embodiment is a nonvolatile semiconductor memory device that can freely and electrically erase/program data and retain the memory content even when the power supply is OFF.

The memory cell MC is, for example, a charge trap memory cell. The charge storage film 32 has many trap sites that trap the charge inside the insulative film and includes, for example, a silicon nitride film.

The tunneling insulating film 31 is used as a potential barrier when the charge is injected from the semiconductor film 20 into the charge storage film 32 or when the charge that is stored in the charge storage film 32 releases into the semiconductor film 20. The tunneling insulating film 31 includes, for example, a silicon oxide film. The blocking insulating film 33 prevents the charge stored in the charge storage film 32 from releasing into the electrode layers 70. Also, the blocking insulating film 33 suppresses the back-tunneling of electrons from the electrode layer 70 in the erasing operation.

The blocking insulating film 33 includes a first blocking film 34 and a second blocking film 35. The first blocking film 34 is, for example, a silicon oxide film and contacts the charge storage film 32. The second blocking film 35 is provided between the first blocking film 34 and the electrode layer 70, and contacts the electrode layer 70.

The second blocking film 35 is a film having a dielectric constant that is higher than that of silicon oxide film and is, for example, a metal oxide film. For example, the second blocking film 35 is an aluminum oxide film or a hafnium oxide film.

As shown in FIG. 1, a drain-side select transistor STD is provided at the upper end portion of the columnar unit CL; and a source-side select transistor STS is provided at the lower end portion. For example, the electrode layer 70 of the lowermost layer functions as a control gate of the source-side select transistor STS. For example, the electrode layer 70 of the uppermost layer functions as a control gate of the drain-side select transistor STD.

As shown in FIG. 1, the plurality of memory cells MC are provided between the drain-side select transistor STD and the source-side select transistor STS. The memory cells MC, the drain-side select transistor STD, and the source-side select transistor STS are connected in series via the semiconductor film 20, and are included in one memory string. The plurality of memory cells MC are provided three-dimensionally in the X-direction, the Y-direction, and the Z-direction by the memory string having, for example, a staggered arrangement in a surface direction parallel to the X-Y plane.

As shown in FIG. 2, the insulating films 63 are provided on the two side surfaces in the Y-direction of the interconnect unit LI dividing the stacked body 100 in the Y-direction. The insulating films 63 are provided between the interconnect unit LI and the stacked body 100.

The interconnect unit LI is, for example, a metal film containing tungsten. The upper end of the interconnect unit LI is connected to the source line SL provided above the stacked body 100 shown in FIG. 1. As shown in FIG. 2, the lower end of the interconnect unit LI contacts the substrate 10. The lower end of the semiconductor film 20 also contacts the substrate 10. The substrate 10 is, for example, a silicon substrate; and a well layer that is doped with an impurity is formed on the front surface side of the substrate 10. The lower end of the semiconductor film 20 is electrically connectable to the source line SL via the substrate 10 and the interconnect unit LI.

As shown in FIG. 2, semiconductor regions 81 are formed in the front surface of the substrate 10 that contacts the lower ends of the interconnect units LI. The plurality of semiconductor regions 81 are provided to correspond to the plurality of interconnect units LI. The multiple semiconductor regions 81 include a p-type semiconductor region 81 and an n-type semiconductor region 81. The p-type semiconductor region 81 supplies electron holes to the semiconductor film 20 via the substrate 10 in the erasing operation. In the read-out operation, electrons are supplied to the semiconductor film 20 from the interconnect unit LI via the n-type semiconductor region 81 and the substrate 10.

By controlling the potential applied to the electrode layer 70 of the lowermost layer provided on the front surface of the substrate 10 with the insulating film 41 interposed between the electrode layer 70 and the substrate 10, a channel is induced in the front surface of the substrate 10 between the semiconductor region 81 and the lower end of the semiconductor film 20; and a current can be caused to flow between the semiconductor region 81 and the lower end of the semiconductor film 20.

The electrode layer 70 of the lowermost layer functions as a control gate for inducing the channel in the front surface of the substrate 10; and the insulating film 41 functions as a gate insulator film.

A method for manufacturing the memory cell array 1 of the embodiment will now be described with reference to FIG. 4 to FIG. 25.

Figure 4:
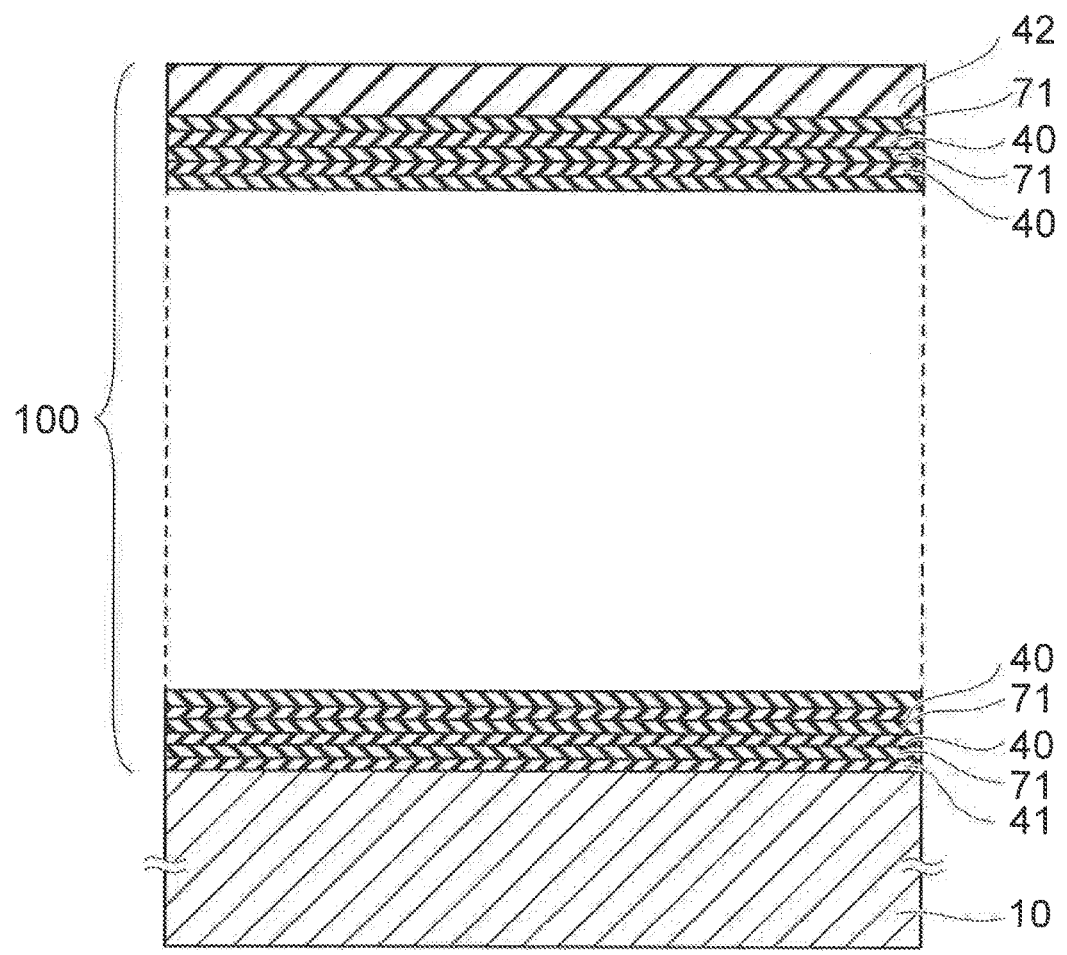
FIGS. 4 to 26 are schematic cross-sectional views showing a method for manufacturing the semiconductor device of the embodiment.

As shown in FIG. 4, the insulating film 41 is formed on the front surface of the substrate 10; and a sacrificial layer (a first layer) 71 is formed on the insulating film 41. The sacrificial layer 71 is replaced with the electrode layer 70 in a subsequent process.

One of the insulating layer (a second layer) 40 and one of the sacrificial layer (the first layer) 71 are stacked alternately on the sacrificial layer 71 of the lowermost layer. The insulating film 42 is formed on the sacrificial layer 71 of the uppermost layer. The sacrificial layers 71 are, for example, silicon nitride films; and the insulating layers 40 are, for example, silicon oxide films. Thus, the stacked body 100 is formed as an etching layer where memory holes MH are to be made.

Figure 5:
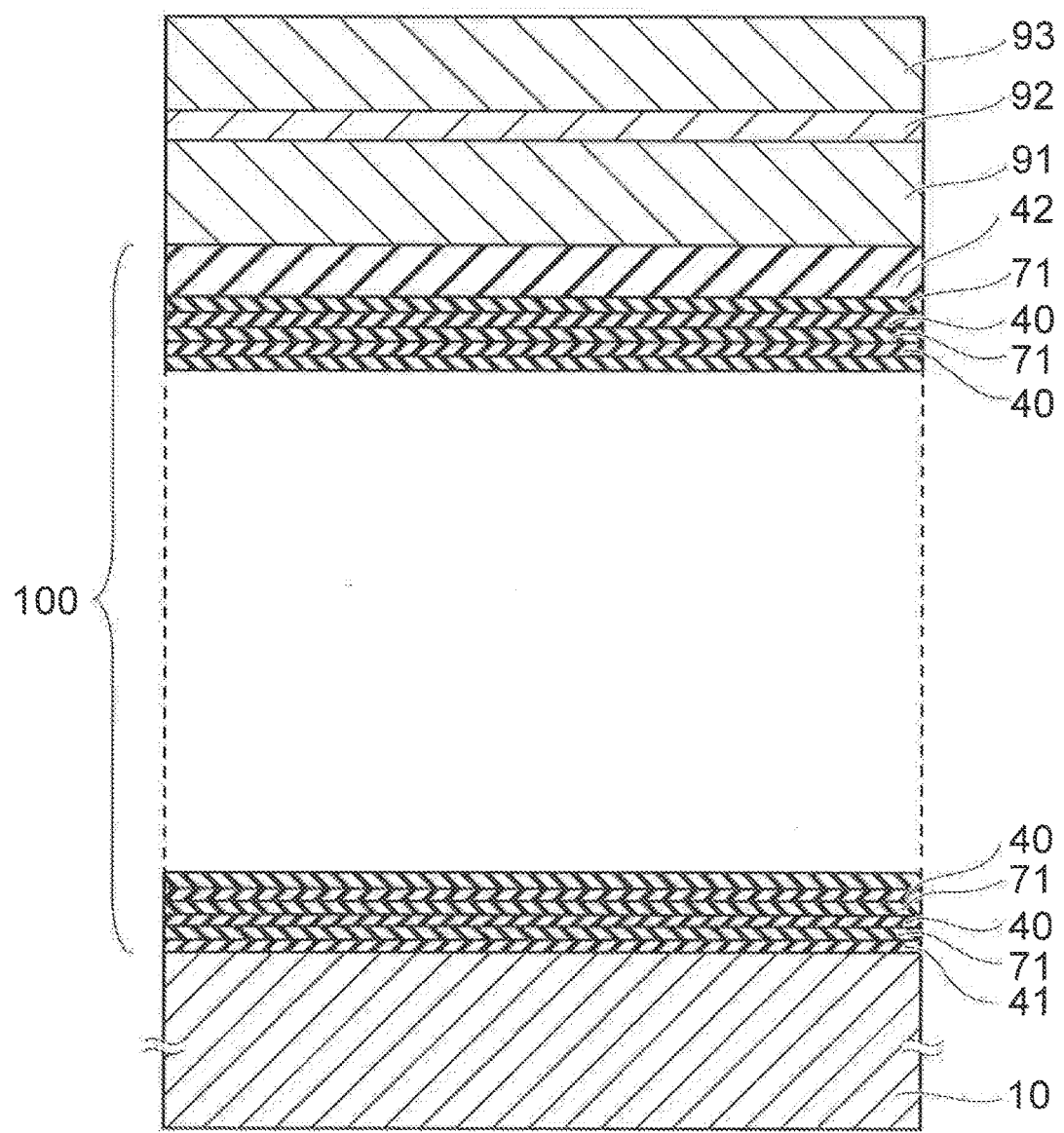

As shown in FIG. 5, a mask layer 91, an intermediate film 92, and a resist film 93 are formed on the stacked body 100. The mask layer 91 is formed on the insulating film 42; the intermediate film 92 is formed on the mask layer 91; and the resist film 93 is formed on the intermediate film 92.

The mask layer 91 is a film of a material that is different from those of the films of the stacked body 100 and is, for example, a carbon film. The intermediate film 92 is a film of a material that is different from those of the mask layer 91 and the resist film 93 and is, for example, a silicon oxide film.

Figure 6:
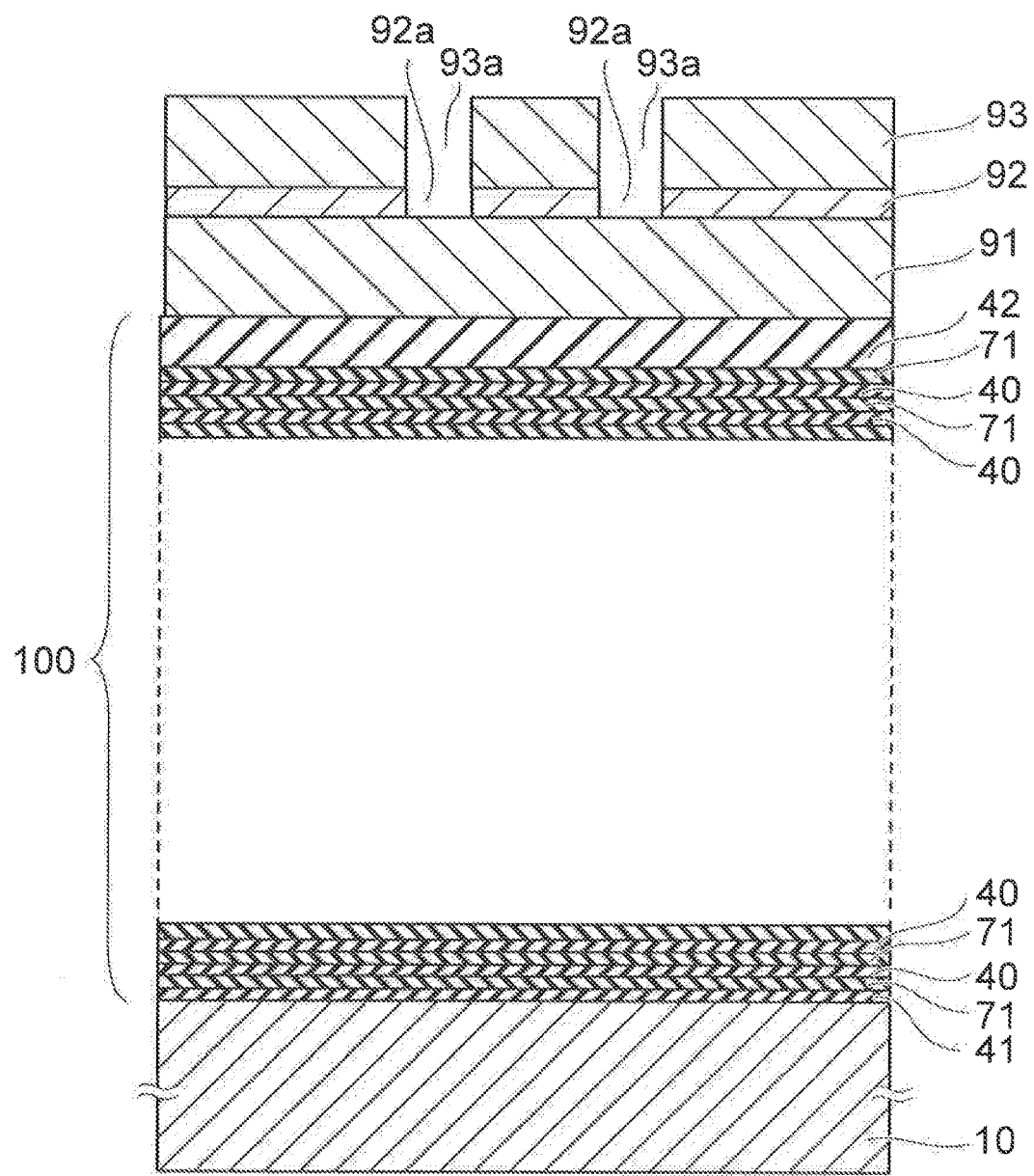

A plurality of holes 93a are made in the resist film 93 as shown in FIG. 6 by performing exposure and developing of the resist film 93.

A plurality of holes 92a are made in the intermediate film 92 by etching the Intermediate film 92 using the resist film 93 as a mask. For example, the intermediate film 92 is etched by RIE using a gas containing fluorine.

Figure 7:
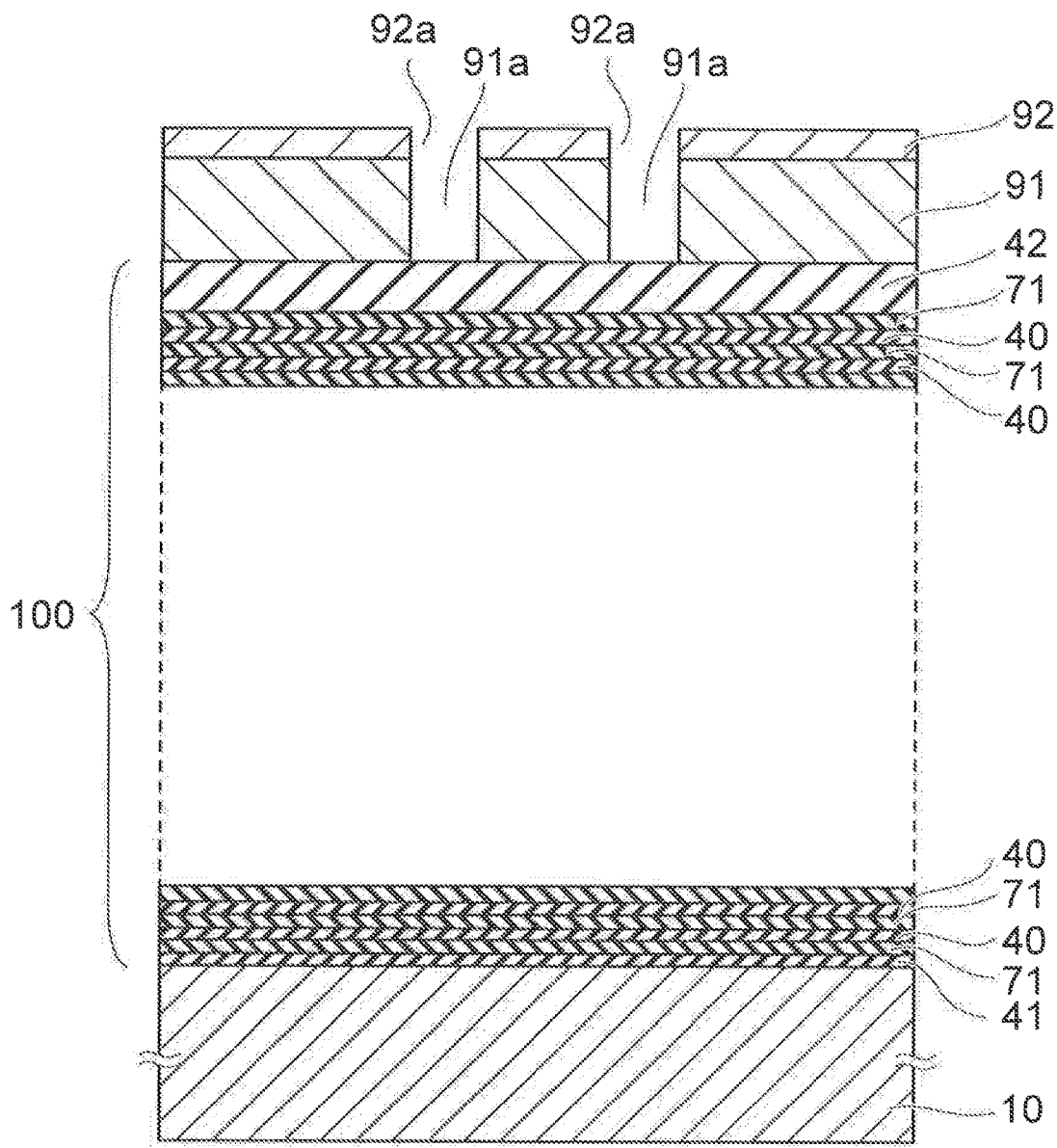

A plurality of holes 91a are made in the mask layer 91 as shown in FIG. 7 by etching the mask layer 91 using the resist film 93 and the intermediate film 92 that are patterned. For example, the mask layer 91 is etched by RIE using a gas containing oxygen.

The resist film 93 which has an organic material as a major component is consumed in the initial etching of the mask layer 91.

Figure 8:
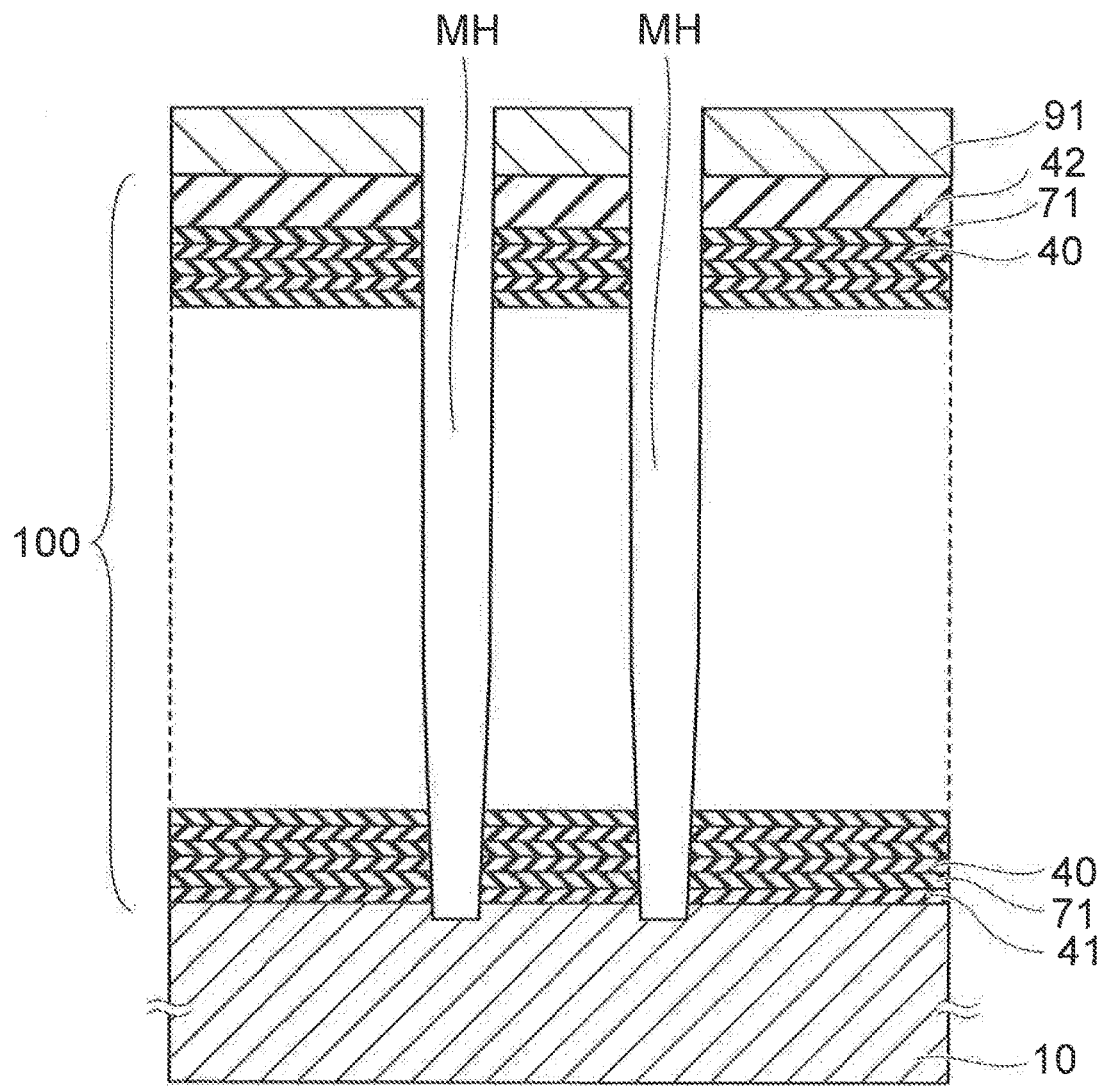

Then, the plurality of memory holes MH are made in the stacked body 100 as shown in FIG. 8 by etching the stacked body 100 using the intermediate film 92 and the mask layer 91 as a mask. The memory holes MH pierce the stacked body 100 and reach the substrate 10.

For example, the sacrificial layers (the silicon nitride films) 71 and the insulating layers (the silicon oxide films) 40 are etched continuously by RIE using a gas containing fluorine without switching the gas.

In the etching of the stacked body 100, the intermediate film 92 is consumed; and the mask layer 91 is further consumed. After the formation of the memory holes MH has ended, a mask layer 91 that is thinner than prior to the etching of the stacked body 100 remains on the stacked body 100.

As higher density progresses for the memory cells in the stacking direction and the planar direction, it is desirable to reduce the diameter of the memory hole MH and increase the number of layers of the sacrificial layers 71 replaced with the electrode layers 70. This increases the aspect ratio of the memory hole MH. When making such a memory hole MH having a high aspect ratio by RIE, the supply amount of the radicals is smaller, and the energy of the ions that arrive is lower at the lower portion of the memory hole MH than at the upper portion of the memory hole MH.

Therefore, it is difficult to form the side surface of the lower portion of the memory hole MH to be perpendicular to the major surface of the substrate 10; and a tapered surface such as that shown in FIG. 8 may be formed. In other words, there is a tendency for the diameter of the lower portion of the memory hole MH to be smaller than the diameter of the upper portion of the memory hole MH. Such fluctuation in the stacking direction of the diameter of the memory hole MH may cause fluctuation of the characteristics of the memory cells above and below.

According to the embodiment as described below, a method for improving the tapered configuration of the lower side surface of the memory hole MH is provided.

Figure 9:
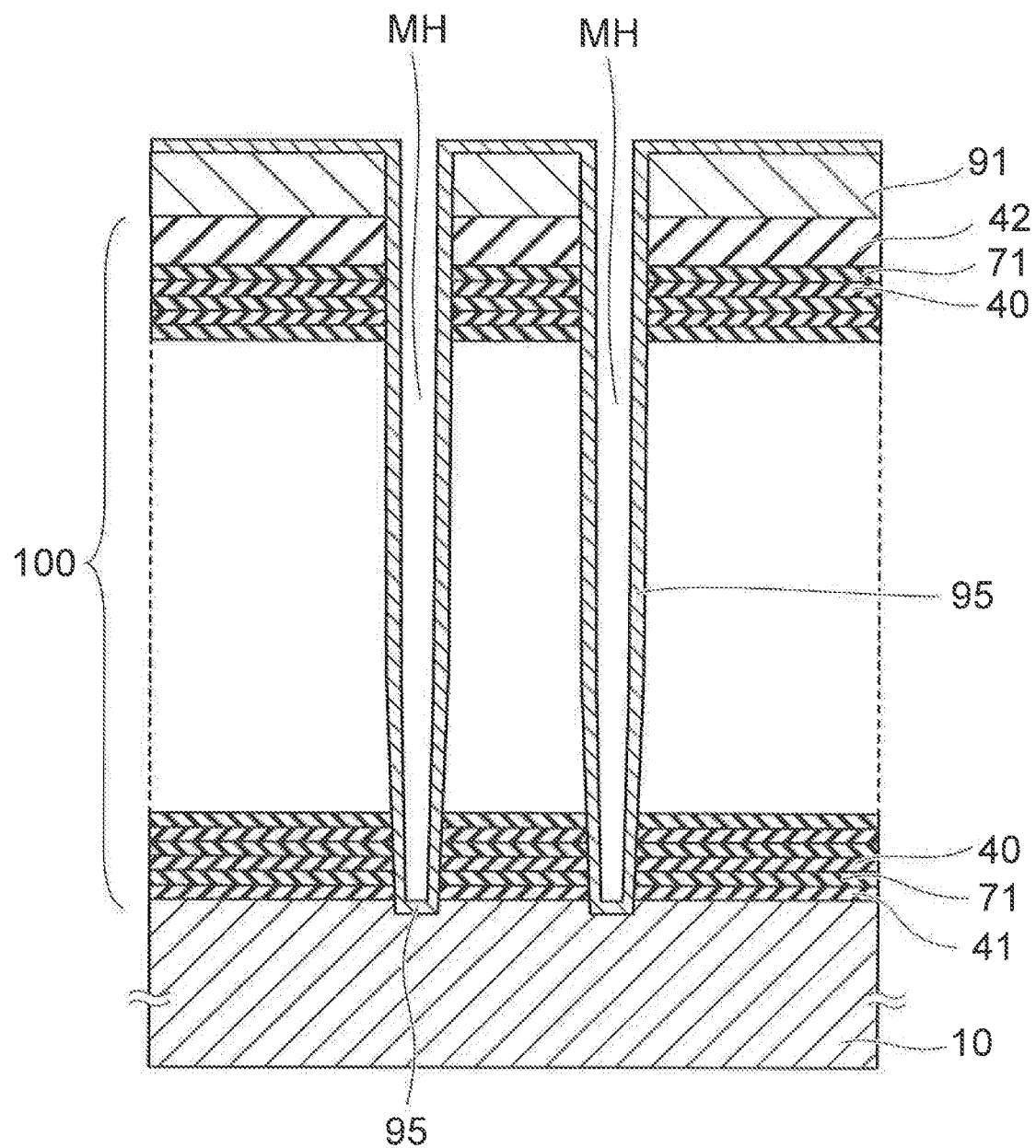

First, as shown in FIG. 9, a first sacrificial film 95 is formed on the side surface and bottom of the memory hole MH. The first sacrificial film 95 is formed also on the upper surface of the mask layer 91 remaining on the stacked body 100.

The first sacrificial film 95 is formed conformally along the upper surface of the mask layer 91 and the side surface and bottom of the memory hole MH without plugging the entrance of the memory hole MH. A cavity remains on the inner side of the first sacrificial film 95.

The first sacrificial film 95 is a film of a material different from those of the insulating film 41, the sacrificial layers 71, and the insulating layers 40 of the stacked body 100 and is, for example, a carbon film.

Figure 10:
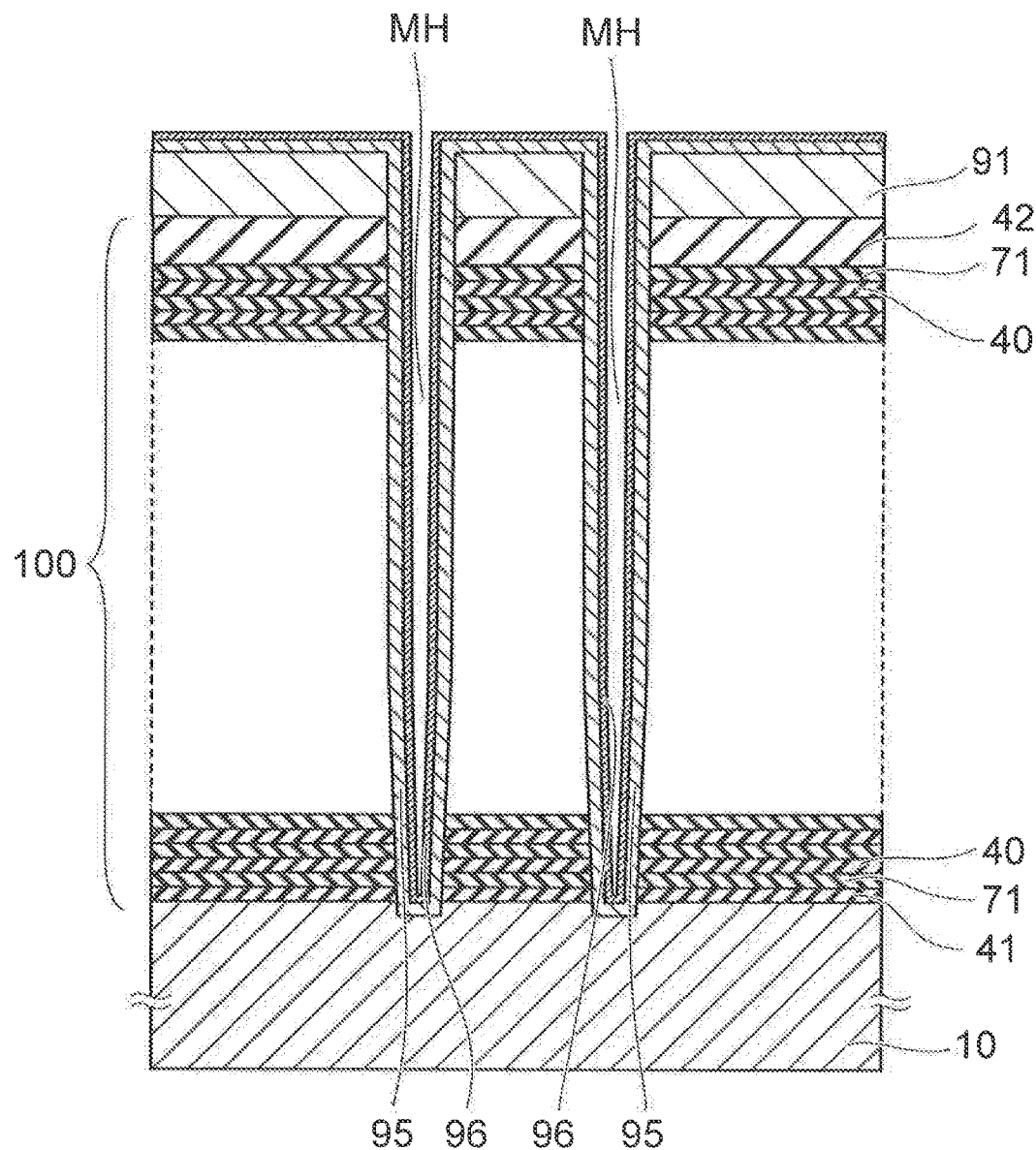

As shown in FIG. 10, a second sacrificial film 96 is further formed on the inner side of the first sacrificial film 95. The second sacrificial film 96 is formed conformally along the first sacrificial film 95 on the upper surface of the mask layer 91, the first sacrificial film 95 formed on the side surface of the memory hole MH, and the first sacrificial film 95 formed on the bottom of the memory hole MH without plugging the entrance of the memory hole MH. A cavity remains on the inner side of the second sacrificial film 96.

The second sacrificial film 96 is a film of a material different from those of the first sacrificial film 95 and the sacrificial layers 71 and is, for example, a silicon oxide film.

For example, the first sacrificial film 95 and the second sacrificial film 96 are formed by chemical vapor deposition (CVD) or atomic layer deposition (ALD).

Figure 11:
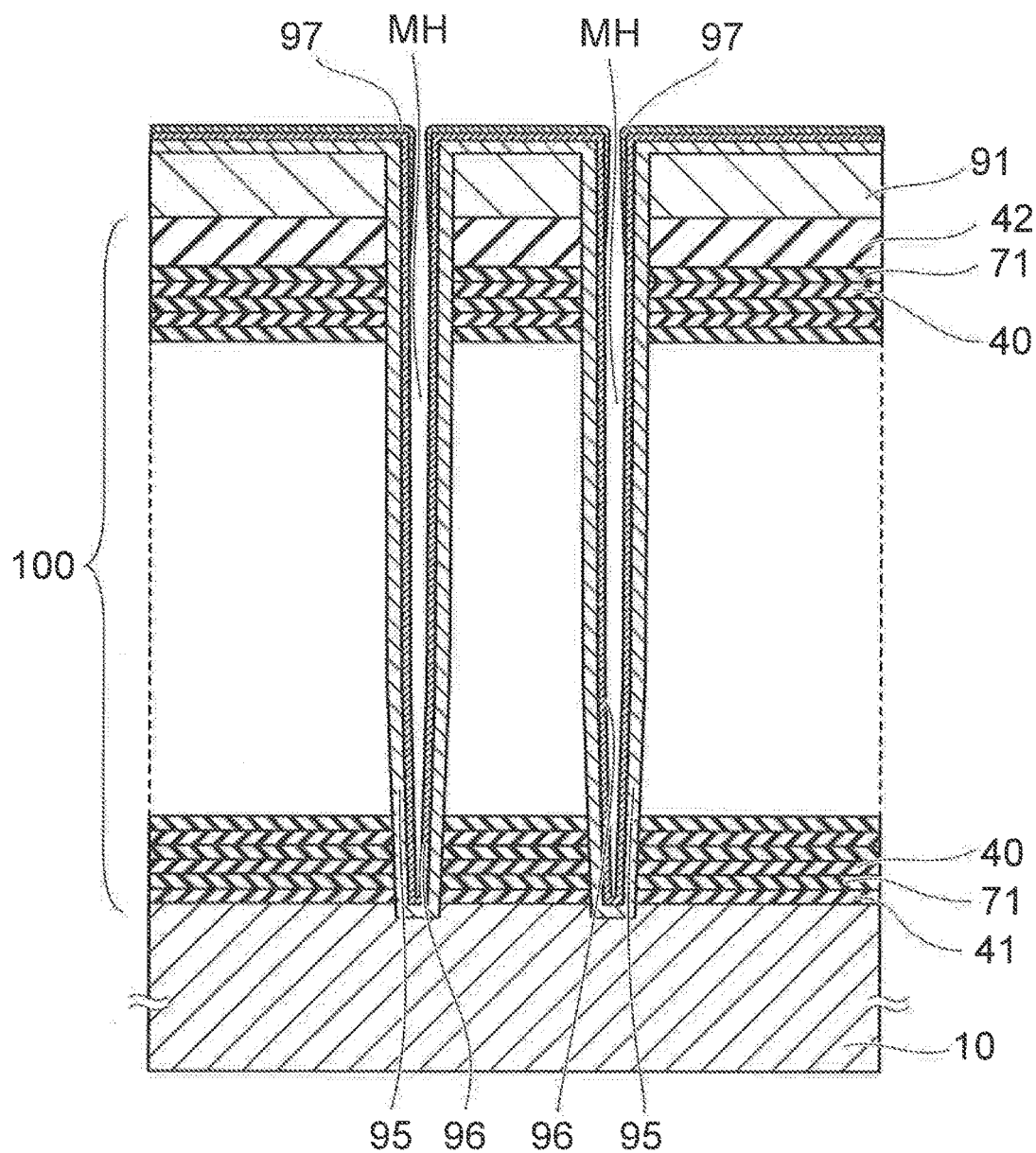

After forming the second sacrificial film 96, a third sacrificial film 97 is further formed as shown in FIG. 11. The third sacrificial film 97 is a film of a material different from that of the first sacrificial film 95 and is, for example, the same silicon oxide film as the second sacrificial film 96.

For example, the third sacrificial film 97 is formed by sputtering, and is formed on the second sacrificial film 96 over the upper surface of the mask layer 91 and on the side surface at the entrance vicinity of the memory hole MH. The target material that is sputtered does not easily enter the inner portion of the memory hole MH having the high aspect ratio; and the second sacrificial film 96 on the bottom of the memory hole MH is not covered with the third sacrificial film 97. The third sacrificial film 97 does not plug the entrance of the memory hole MH.

The third sacrificial film 97 covers the corner from the upper surface of the mask layer 91 to the side surface at the entrance vicinity of the memory hole MH. Such a third sacrificial film 97 is included with the second sacrificial film 96 in a cover film that is thicker than the second sacrificial film 96 on the bottom of the memory hole MH.

It is also possible to form the second sacrificial film 96 without forming the third sacrificial film 97 by performing film formation control of the second sacrificial film 96 so that the second sacrificial film 96 that covers the first sacrificial film 95 on the upper surface of the mask layer 91 and the corner recited above is thicker than the second sacrificial film 96 that is on the bottom of the memory hole MH.

Figure 12:
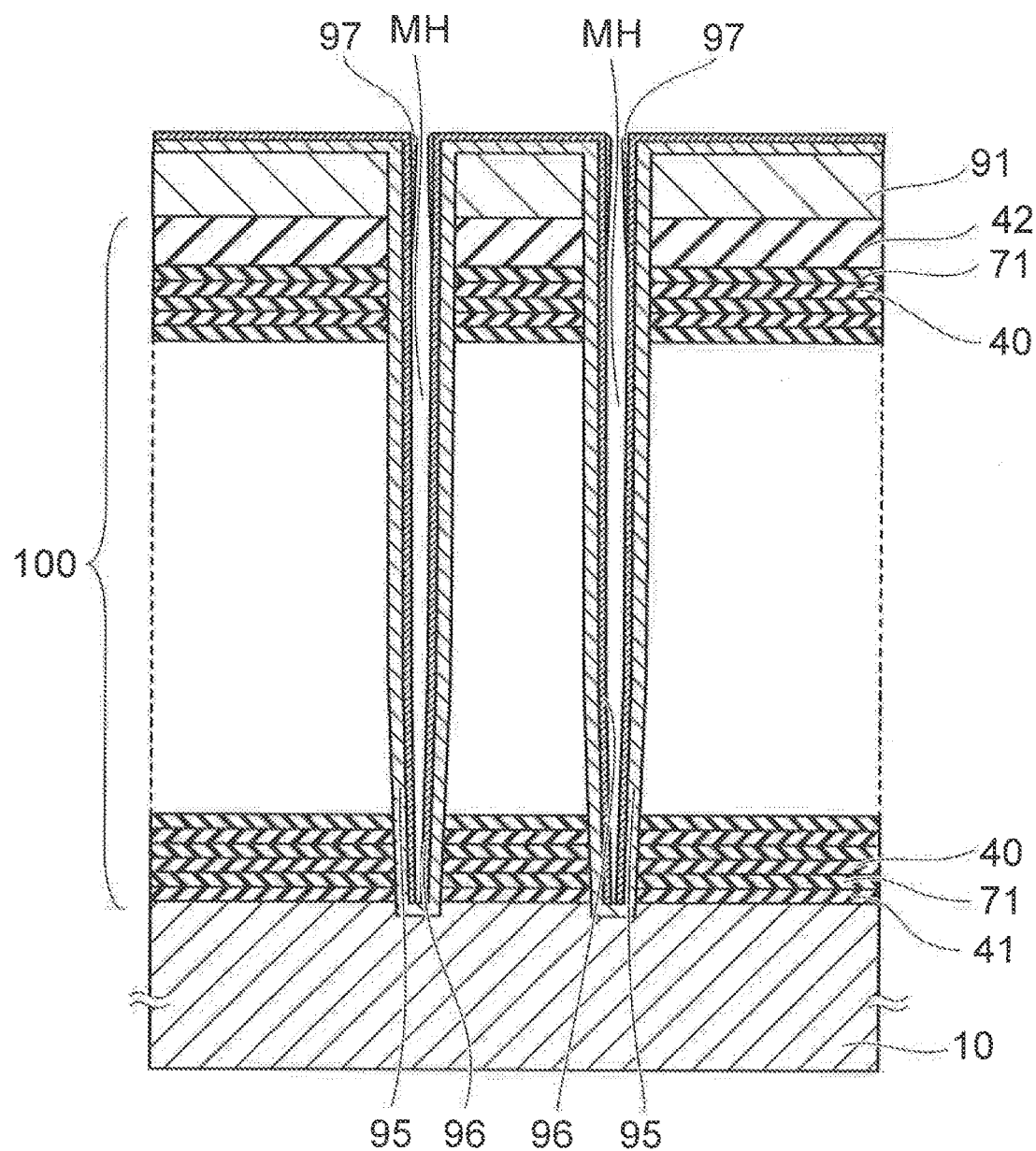

Then, the second sacrificial film 96 on the bottom of the memory hole MH is removed by RIE. The second sacrificial film 96 that is on the bottom is removed; and the first sacrificial film 95 that is on the bottom of the memory hole MH is exposed as shown in FIG. 12.

When performing the RIE, the third sacrificial film 97 that is over the upper surface of the mask layer 91 also is etched and is consumed or becomes thinner. Regardless, the first sacrificial film 95 on the upper surface of the mask layer 91 and the first sacrificial film 95 of the corner recited above are protected from the RIE recited above by the cover film including at least the second sacrificial film 96. The first sacrificial film 95 on the upper surface of the mask layer 91 and the first sacrificial film 95 of the corner are not exposed. Further, the first sacrificial film 95 that is formed on the side surface of the memory hole MH is covered with the second sacrificial film 96 and is not exposed.

Thereafter, the processes shown in FIG. 13A to FIG. 14B are continued.

FIG. 13A to FIG. 14B are schematic enlarged cross-sectional views of the stacked portion including the two lowermost layers of the sacrificial layers 71 and the lower portion on the bottom side of the memory hole MH made in the stacked portion.

Figure 13A:
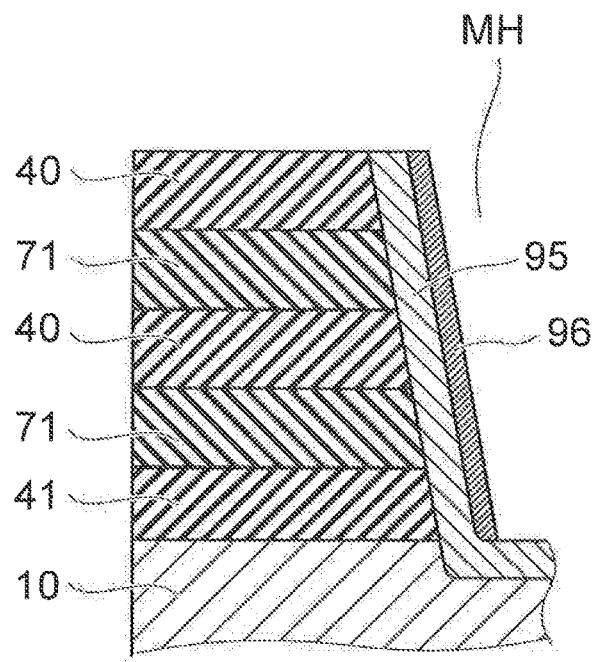

The stacked portion shown in FIG. 13A shows the portion of the cross section shown in FIG. 12 adjacent to the side surface on the left side of the left and right side surfaces on either side of the central axis of the memory hole MH.

As shown in FIG. 13A, the first sacrificial film 95 is exposed on the bottom of the memory hole MH. For example, isotropic etching of the first sacrificial film 95 is performed using a gas containing oxygen. The isotropy of the etching is strengthened by setting the gas pressure to be high and setting the ion energy to be low.

Figure 13B:
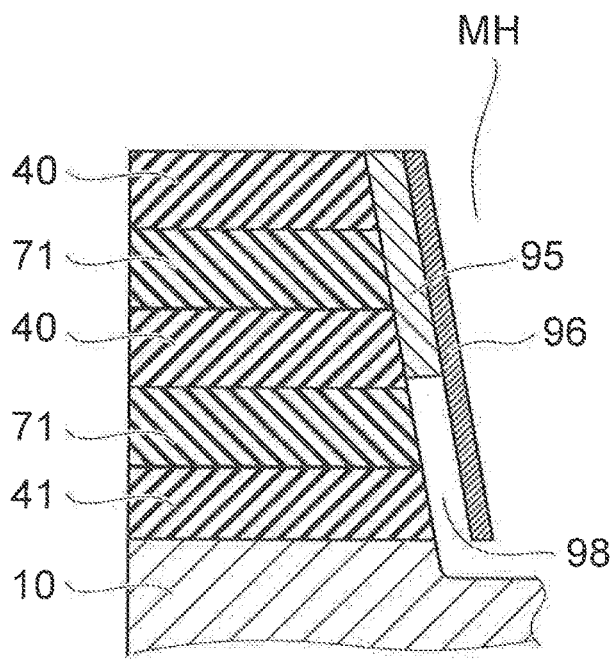

As shown in FIG. 13B, the etching of the first sacrificial film 95 progresses along the side surface of the lower portion of the memory hole MH from the exposed portion on the bottom of the memory hole MH. For example, the etching of the first sacrificial film 95 is stopped at the timing when the sacrificial layer 71 of the lowermost layer is exposed. A gap 98 is made in the portion where the first sacrificial film 95 is etched and removed.

The etching selectivity of the first sacrificial film 95 with respect to the substrate 10, the insulating film 41, the sacrificial layers 71, the insulating layers 40, and the second sacrificial film 96 is sufficiently high. The second sacrificial film 96 and the stacked films of the stacked body 100 are not removed; and the gap 98 is made between the second sacrificial film 96 and the stacked films of the stacked body 100. The gap 98 is made between the second sacrificial film 96 and the lower side surface on the bottom side of the memory hole MH. Among the sacrificial layers 71, at least the sacrificial layer 71 of the lowermost layer is exposed in the gap 98.

For example, isotropic side etching using a gas containing fluorine and oxygen is caused to progress from the end of the sacrificial layer 71 of the lowermost layer exposed in the gap 98. For example, a gas containing $NF_3$ and $O_2$ or a gas containing $SF_6$ and $O_2$ can be used as the gas at this time. The isotropy of the etching is strengthened by setting the gas pressure to be high and setting the ion energy to be low.

Figure 14A:
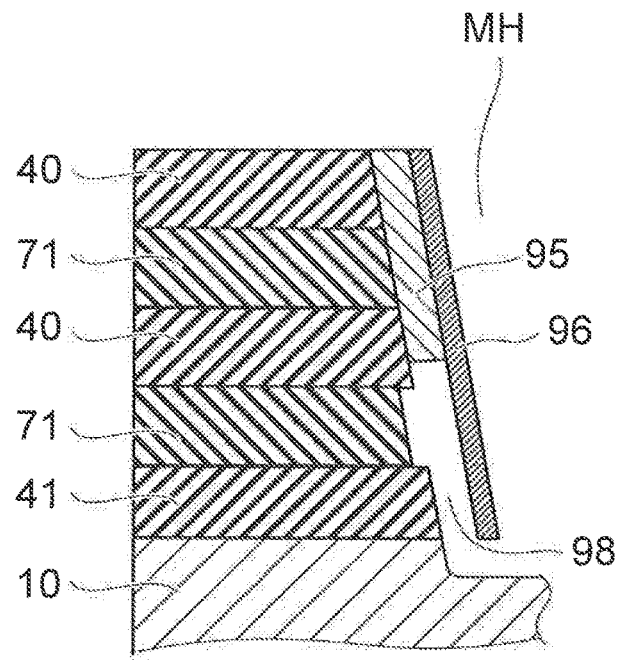

As shown in FIG. 14A, the end of the sacrificial layer 71 of the lowermost layer exposed in the gap 98 recedes in the diametrical direction of the memory hole MH due to the effect of mainly the radicals supplied to the gap 98 through the memory hole MH. The end of the sacrificial layer 71 recedes in a direction away from the second sacrificial film 96.

The etching selectivity of the sacrificial layers 71 with respect to the substrate 10, the insulating film 41, the insulating layers 40, and the second sacrificial film 96 is sufficiently high; and the substrate 10, the insulating film 41, the insulating layers 40, and the second sacrificial film 96 are substantially not etched.

Then, for example, the isotropic etching of the first sacrificial film 95 using a gas containing oxygen is performed again. At this time, the etching gas enters the gap 98 through the bottom of the memory hole MH; and the first sacrificial film 95 recedes upward along the lower side surface of the memory hole MH. In other words, the gap 98 extends upward along the lower side surface of the memory hole MH.

For example, the etching of the first sacrificial film 95 is stopped at the timing when the sacrificial layer 71 of the second layer from the bottom is exposed in the gap 98.

Actually, because oxygen is contained in the gas when performing the side etching of the sacrificial layers 71 and because the first sacrificial film 95 also is etched at that time, this etching amount also is considered and the etching time is adjusted when causing the first sacrificial film 95 to recede.

Figure 14B:
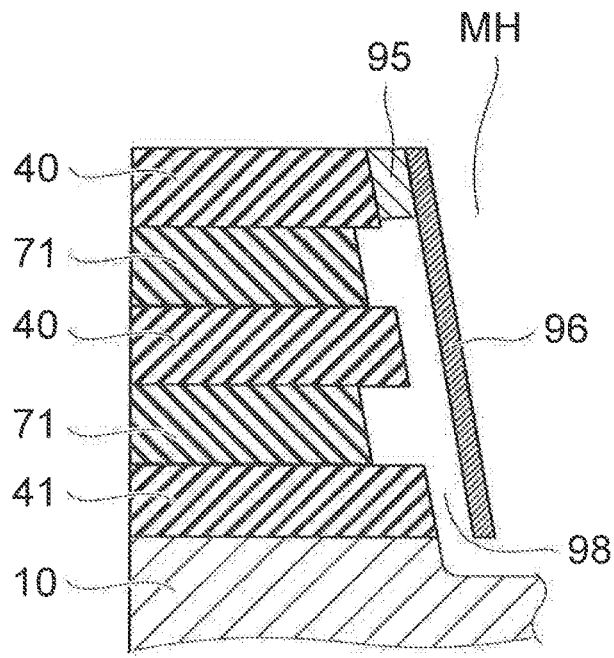

Then, for example, the isotropic side etching using the gas containing fluorine and oxygen again is caused to progress from the ends of the sacrificial layers 71 exposed in the gap 98. As shown in FIG. 14B, the end of the sacrificial layer 71 of the lowermost layer exposed in the gap 98 and the end of the sacrificial layer 71 of the second layer from the bottom recede in the diametrical direction of the memory hole MH. The ends of the sacrificial layers 71 recede in a direction away from the second sacrificial film 96.

At the point in time when the side etching for the two sacrificial layers 71 has ended, the receded amount of the end of the sacrificial layer 71 of the lowermost layer already subjected once to the side etching is larger than the receded amount of the end of the sacrificial layer 71 of the second layer from the bottom.

Thereafter, the first sacrificial film 95 being caused to recede upward along the memory hole MH side surface and the side etching of the ends of the sacrificial layers 71 described above are multiply repeated. The side etching amount, i.e., the receded amount in the diametrical direction of the memory hole MH, is larger for the sacrificial layers 71 of the lower layers.

Figure 15A:
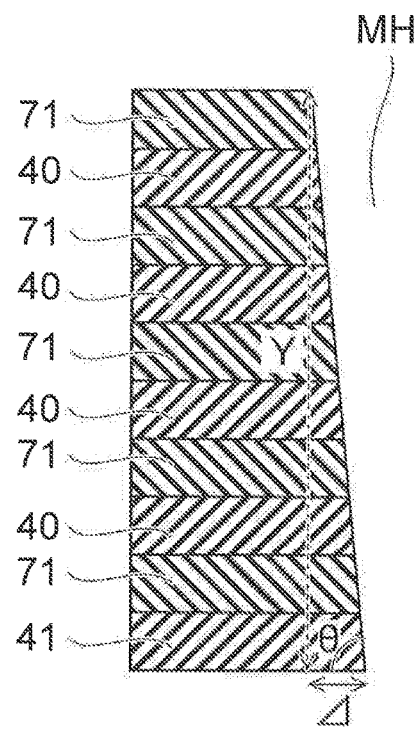

FIG. 15A is a schematic enlarged cross-sectional view of the ten lowermost layers of the stacked portion of the stacked body 100 shown in FIG. 8 prior to forming the first sacrificial film 95. The five lowermost layers of the sacrificial layers 71 are included in the ten lowermost layers of the stacked portion.

The stacked portion shown in FIG. 15A shows the portion of the cross section shown in FIG. 8 adjacent to the side surface on the left side of the left and right side surfaces on either side of the central axis of the memory hole MH.

An amount $\Delta$ that the lower surface of the stacked portion protrudes further than the upper surface toward the central axis side of the memory hole MH is expressed by $\Delta = Y/\tan\theta$, where the thickness of the ten lowermost layers of the stacked portion is Y (nm), and the angle between the side surface of the memory hole MH and the lower surface of the stacked portion is $\theta$.

For example, by the first sacrificial film 95 receding upward, the sacrificial layers 71 are exposed in the gap 98 one layer at a time in order from the sacrificial layer 71 of the lowermost layer. A case will now be described as an example where the side etching amount of the sacrificial layer 71 per side etching is controlled to be, for example, $(1/5)\Delta$ and the side etching of the sacrificial layers 71 is performed a total of five times.

Figure 15B:
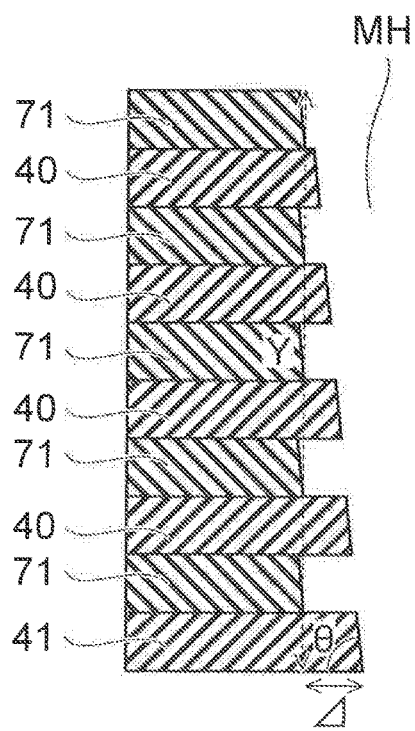

FIG. 15B shows the state after the sacrificial layers 71 are subjected to the side etching five times.

The sacrificial layer 71 of the lowermost layer is subjected to the side etching five times; and the total side etching amount (the receded amount) is $\Delta$.

The sacrificial layer 71 of the second layer from the bottom is subjected to the side etching four times; and the total side etching amount is $(4/5)\Delta$.

The sacrificial layer 71 of the third layer from the bottom is subjected to the side etching three times; and the total side etching amount is $(3/5)\Delta$.

The sacrificial layer 71 of the fourth layer from the bottom is subjected to the side etching twice; and the total side etching amount is $(2/5)\Delta$.

The sacrificial layer 71 of the fifth layer from the bottom is subjected to the side etching once; and the total side etching amount is $(1/5)\Delta$.

Thus, the jutting of the sacrificial layers 71 on the lower layer side toward the central axis of the memory hole MH is eliminated. The fluctuation between the distance between the side surfaces on either side of the central axis of the memory hole MH (an inner-side surface distance) for the sacrificial layers 71 on the upper layer side and the inter-side surface distance of the sacrificial layers 71 on the lower layer side is relaxed.

The first sacrificial film 95 formed on the upper side surface of the memory hole MH and the first sacrificial film 95 formed on the upper surface of the mask layer 91 are covered with at least the second sacrificial film 96. The gas when etching the first sacrificial film 95 is supplied to the gap 98 through only the bottom of the memory hole MH. Accordingly, when exposing the ends of the sacrificial layers 71 on the memory hole MH side, the etching of the first sacrificial film 95 progresses from the bottom side of the memory hole MH; and the etching of the first sacrificial film 95 does not progress from the upper portion of the memory hole MH.

Figure 16:
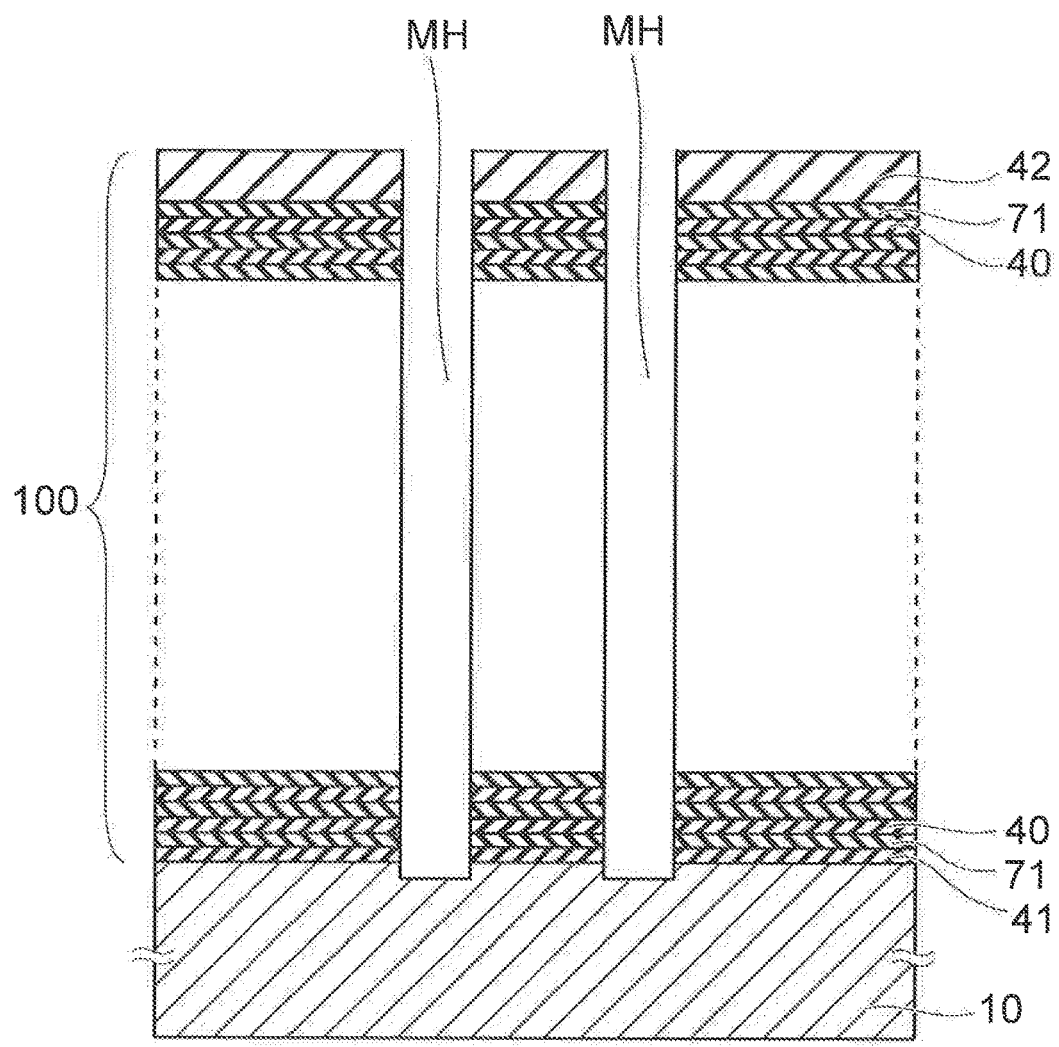

Accordingly, the diameter of only the lower portion of the memory hole MH having the tapered configuration can be spread. As a result, as shown in FIG. 16, it becomes possible to relax the fluctuation between the upper and lower diameters of the memory hole MH.

The sacrificial layers 71 that are exposed by one upward receding of the first sacrificial film 95 are not limited to one layer; and a plurality of the sacrificial layers 71 may be exposed by one upward receding of the first sacrificial film 95. Also, the number of layers of sacrificial layers 71 that are subjected to the side etching is not limited to five layers; and the total number of times the side etching is performed for the sacrificial layers 71 is not limited to five times.

After eliminating or relaxing the tapered configuration of the lower portion of the memory hole MH as described above, the third sacrificial film 97, the second sacrificial film 96, and the first sacrificial film 95 that remain are removed. For example, the third sacrificial film 97 and the second sacrificial film 96 are removed using BHF (buffered hydrogen fluoride). For example, the first sacrificial film 95 is removed using oxygen gas.

As shown in FIG. 15B, although the fluctuation in the stacking direction of the distance between the side surfaces on either side of the central axis of the memory hole MH is not relaxed for the insulating layers 40, there is little effect on the cell characteristics because the insulating layers 40 are not components that function as electrodes of the memory cells.

When removing the third sacrificial film 97 and the second sacrificial film 96, the insulating layer 40 which is the same type as the third sacrificial film 97 and the second sacrificial film 96 also is etched at the lower portion of the memory hole MH where the first sacrificial film 95 recedes upward from the bottom side. And the jutting toward the memory hole MH central axis of the insulating layer 40 is relaxed somewhat.

As shown in FIG. 16 as described above, the tapered configuration of the lower portion of the memory hole MH is eliminated or relaxed. Also, for example, the mask layer 91 that remains on the stacked body 100 is removed when removing the first sacrificial film 95 which is the same type as the mask layer 91.

Figure 17:
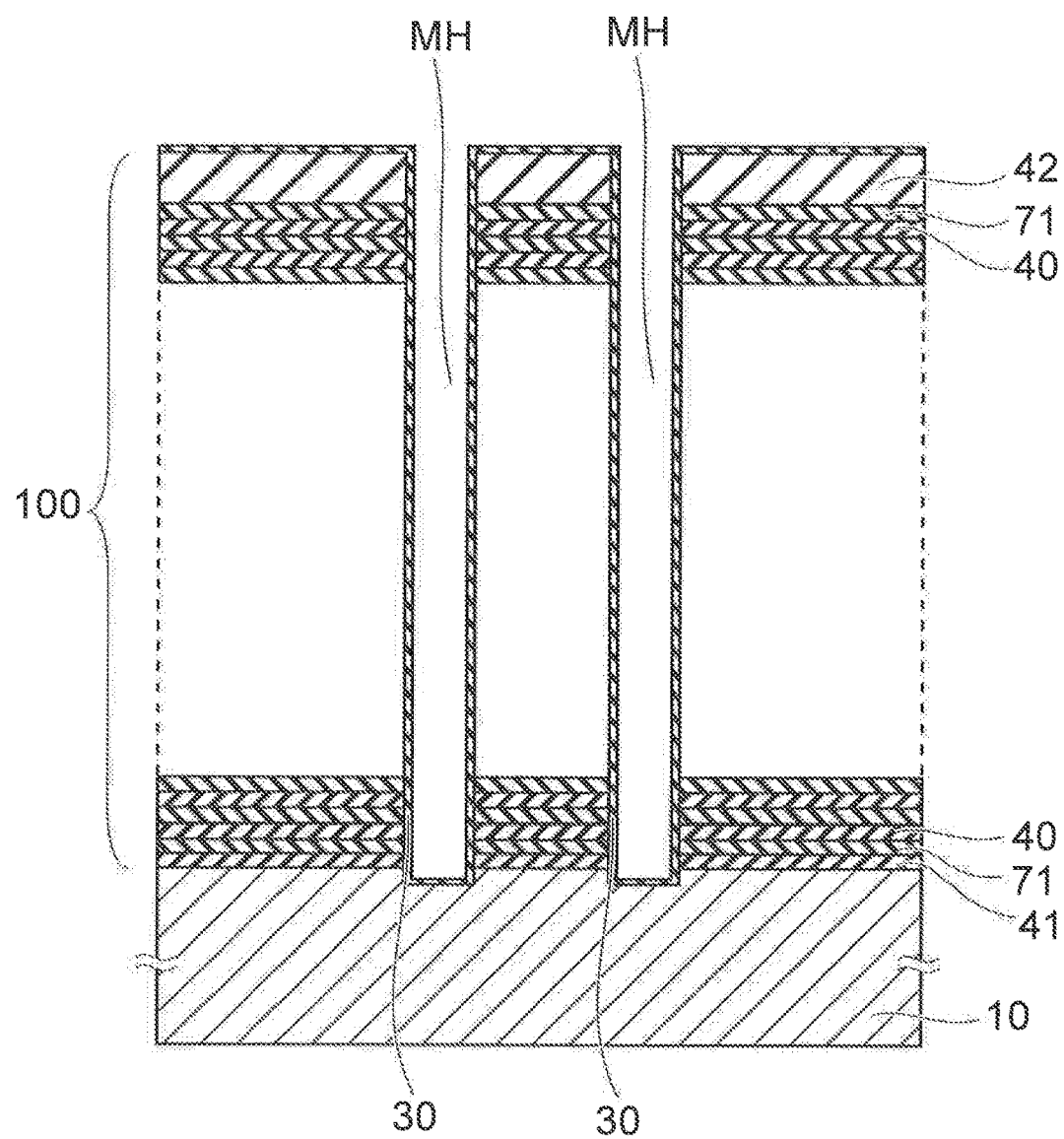
Figure 18:
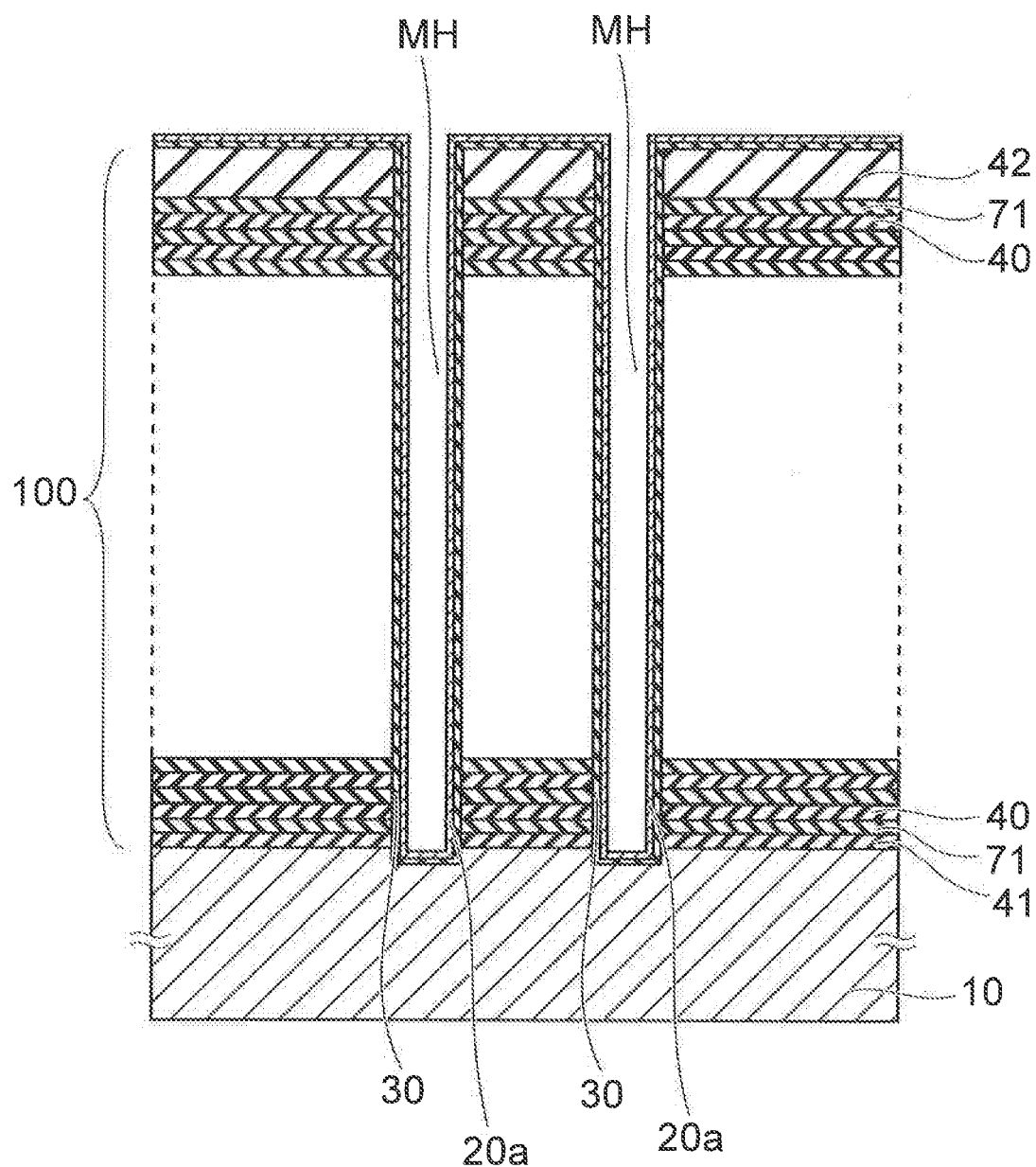

Then, the memory film 30 is formed on the side surface and bottom of the memory hole MH as shown in FIG. 17; and a cover film 20a is formed on the inner side of the memory film 30 as shown in FIG. 18.

Figure 19:
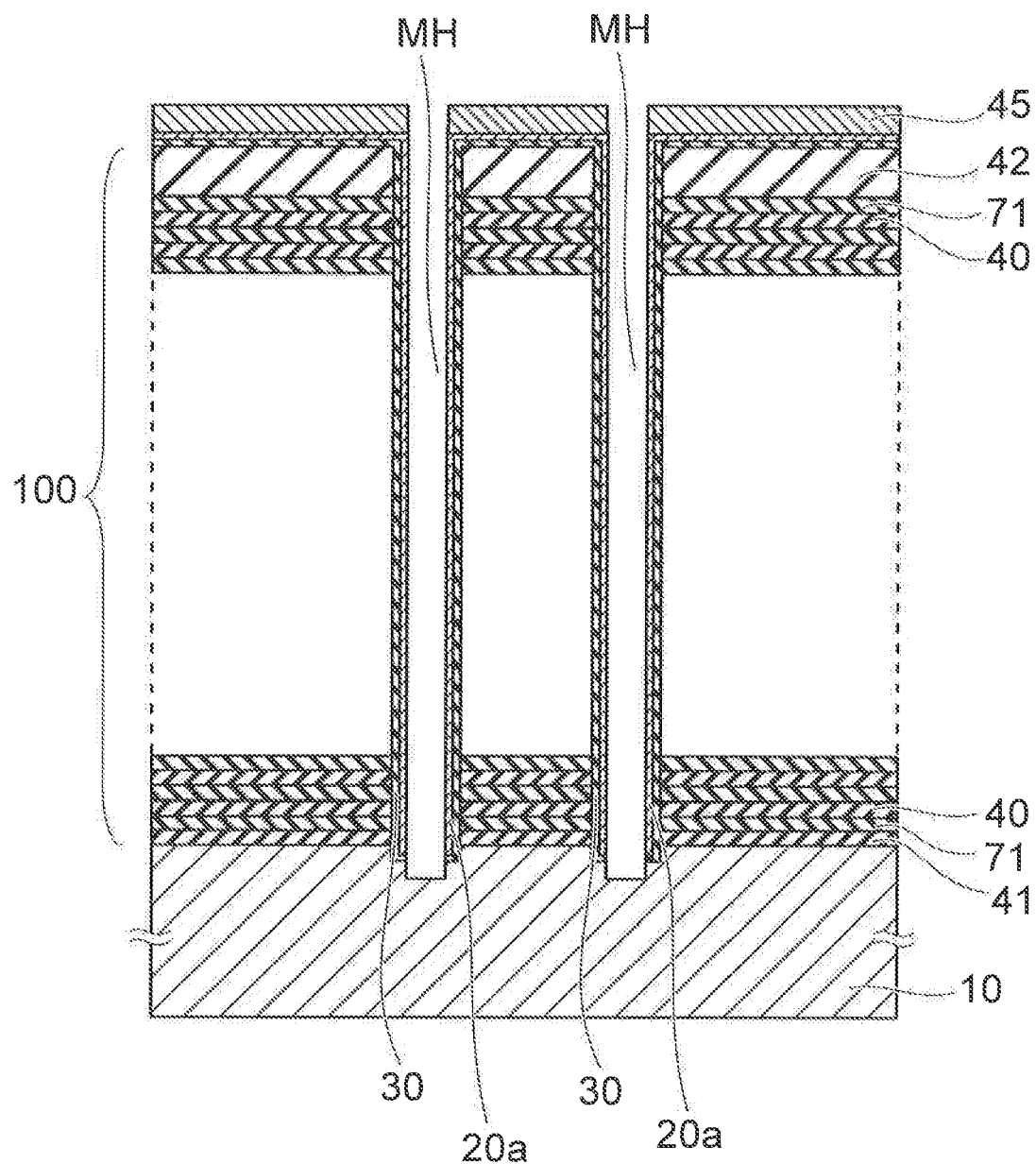

As shown in FIG. 19, a mask layer 45 is formed on the upper surface of the stacked body 100; and the cover film 20a and the memory film 30 that are formed on the bottom of the memory hole MH are removed by RIE. In the RIE, the memory film 30 that is formed on the side surface of the memory hole MH is protected by being covered with the cover film 20a. Accordingly, the memory film 30 that is formed on the side surface of the memory hole MH is not damaged by the RIE.

Figure 20:
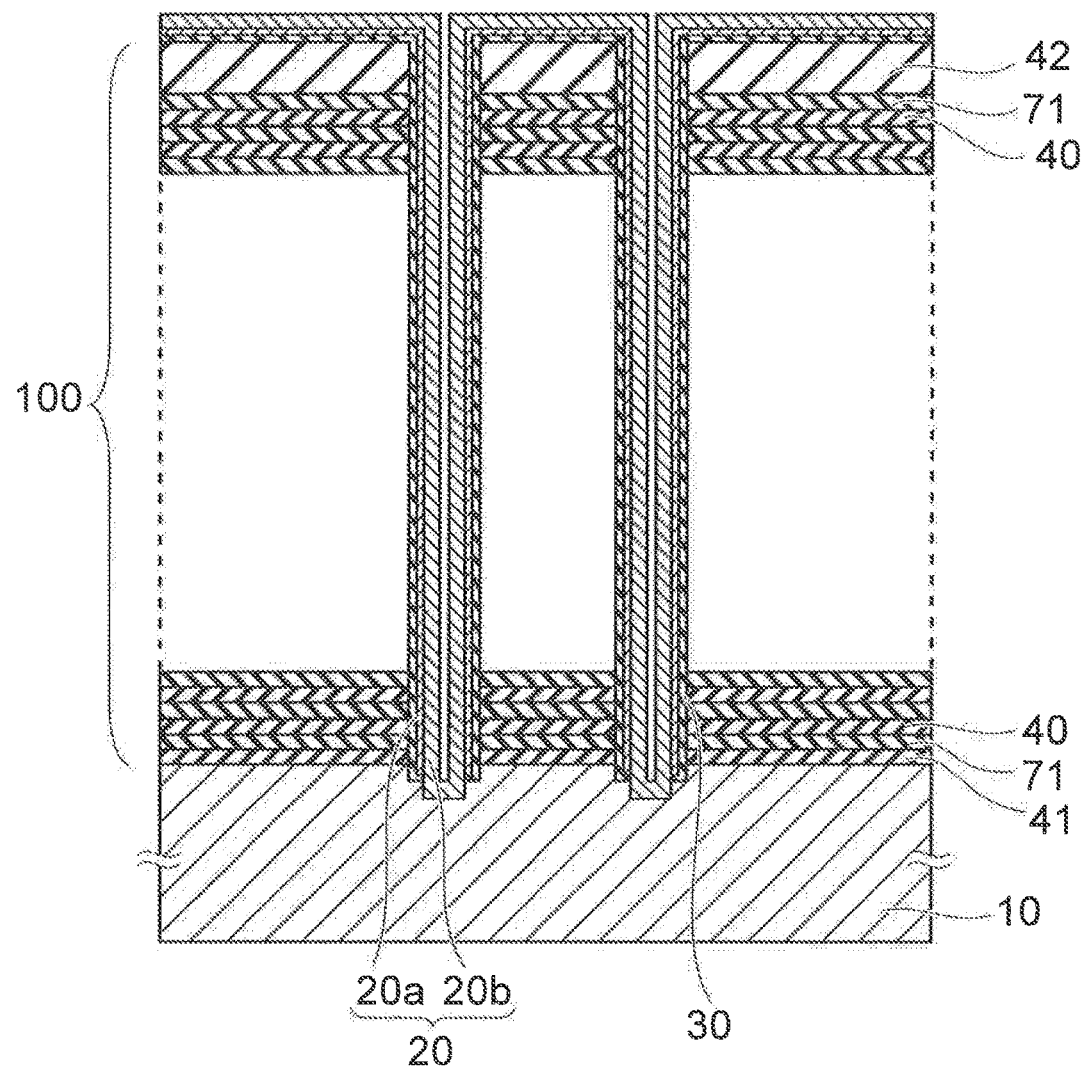

After removing the mask layer 45, a semiconductor film 20b is formed inside the memory hole MH as shown in FIG. 20. The semiconductor film 20b is formed on the side surface of the cover film 20a and on the bottom of the memory hole MH where the substrate 10 is exposed.

For example, after forming the cover film 20a and the semiconductor film 20b as amorphous silicon films, the cover film 20a and the semiconductor film 20b are crystallized into polycrystalline silicon films by heat treatment. The cover film 20a and the semiconductor film 20b are included in a portion of the semiconductor film 20 described above.

Figure 21:
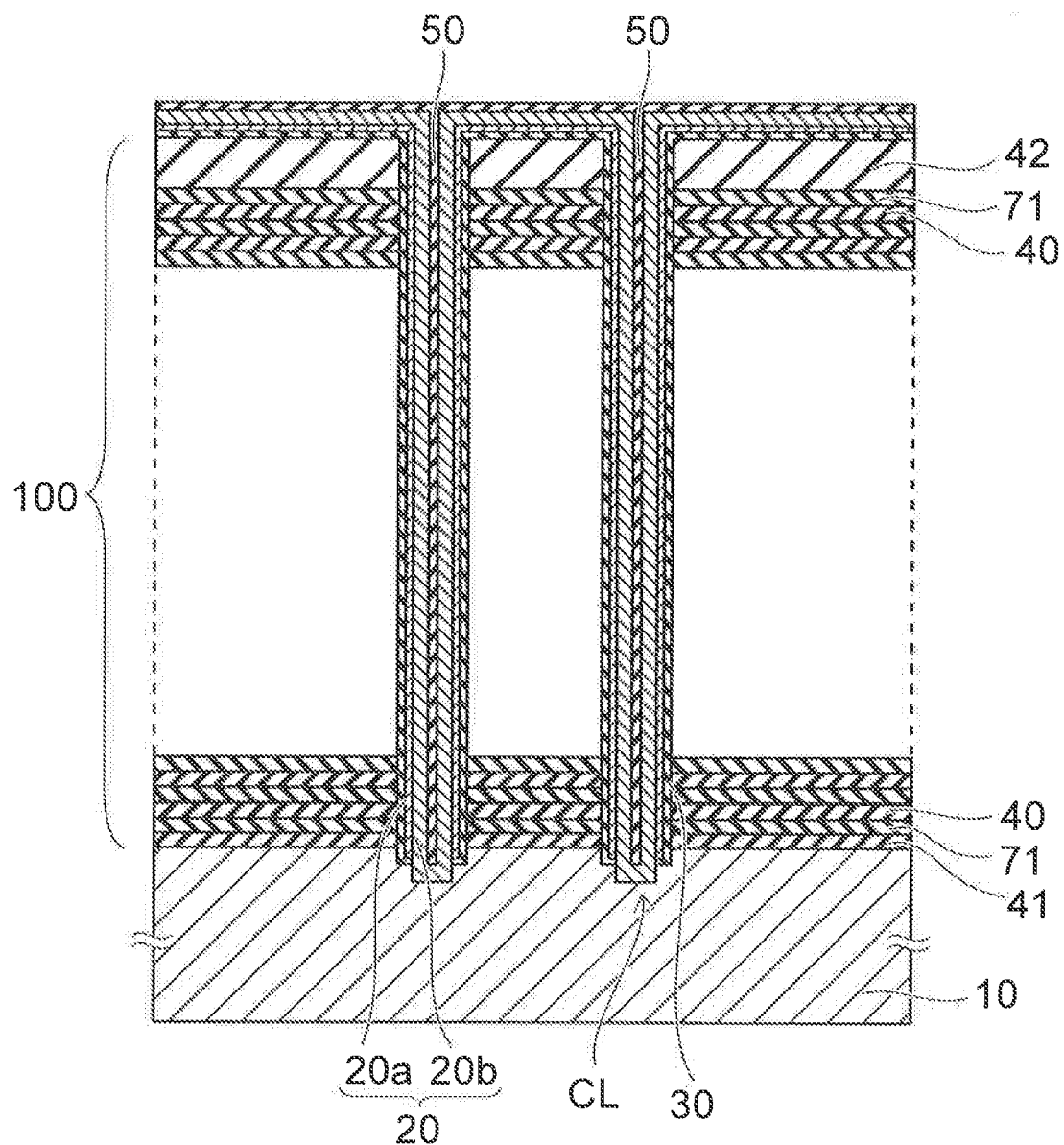

As shown in FIG. 21, the core film 50 is formed on the inner side of the semiconductor film 20b. The stacked film of the memory film 30, the semiconductor film 20, and the core film 50 is included in the columnar unit CL.

Figure 22:
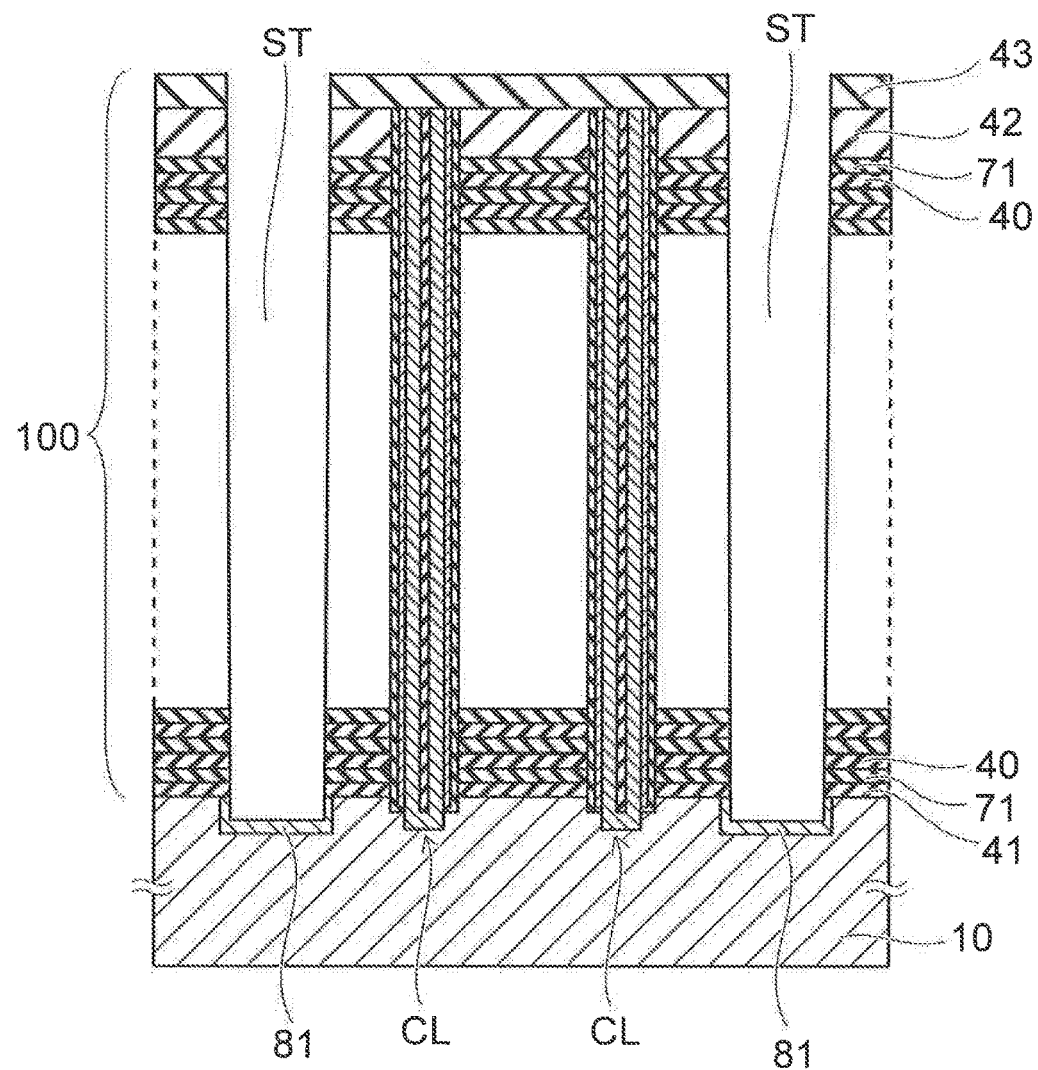

The films that are deposited on the insulating film 42 shown in FIG. 21 are removed by chemical mechanical polishing (CMP) or etch-back. Subsequently, as shown in FIG. 22, the insulating film 43 is formed on the insulating film 42. The insulating film 43 covers the upper ends of the columnar units CL.

Then, by RIE using a mask layer similar to that when making the memory holes MH, a plurality of slits ST are made in the stacked body 100 that includes the insulating films 41, 42, and 43, the sacrificial layers 71 and the insulating layers 40. The slits ST pierce the stacked body 100 at the vicinity of the columnar units CL and reach the substrate 10.

The plurality of semiconductor regions 81 are formed on the front surface of the substrate 10 at the bottoms of the slits ST. The plurality of semiconductor regions 81 include the p-type semiconductor region 81 and the n-type semiconductor region 81.

Figure 23:
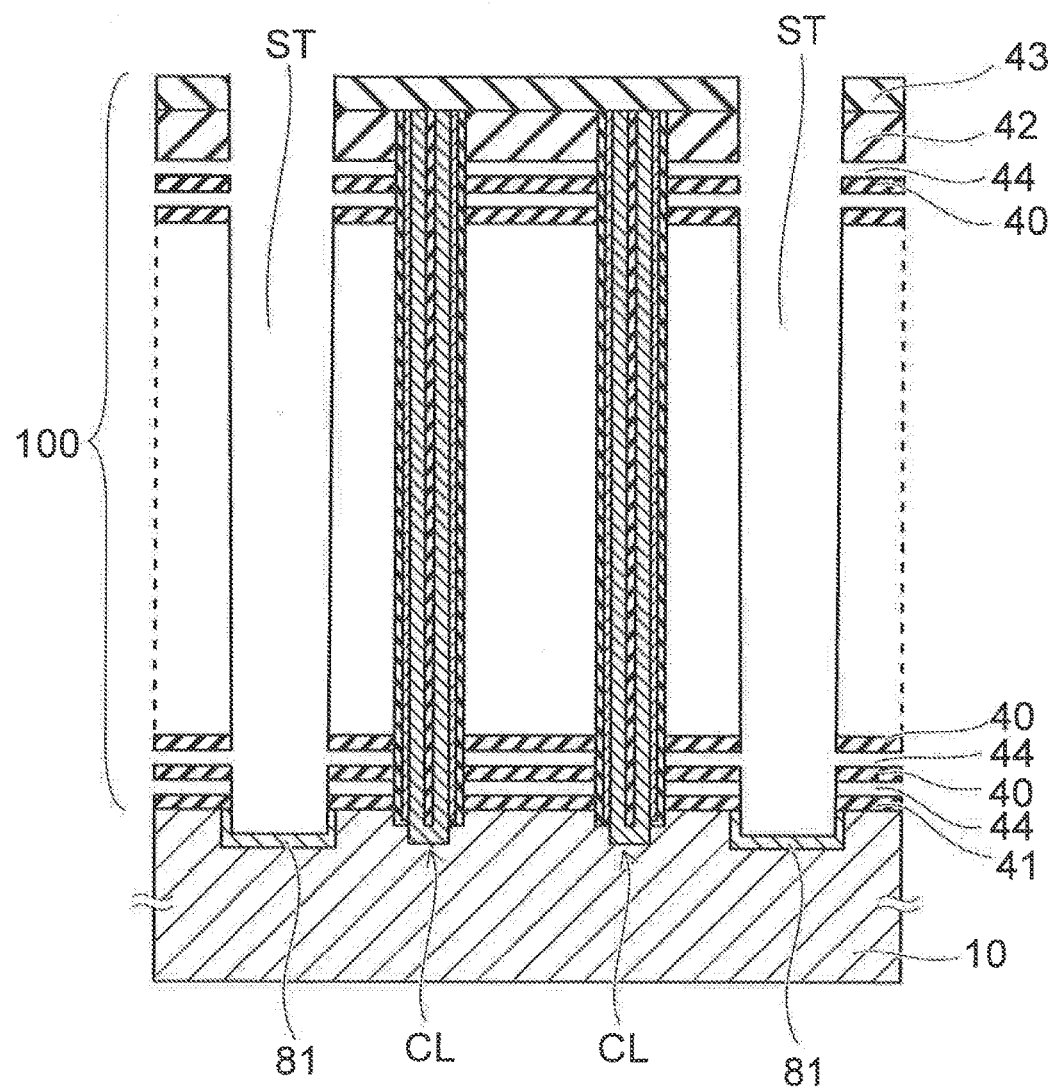

Then, the sacrificial layers 71 are removed by an etchant supplied through the slits ST. As shown in FIG. 23, air gaps 44 are made between the insulating layers 40 adjacent to each other in the stacking direction by the removal of the sacrificial layers 71.

For example, the sacrificial layers 71 which are silicon nitride films are removed by an etchant containing phosphoric acid. The etching selectivity of the sacrificial layers 71 with respect to the insulating layers 40, the insulating films 41, 42, and 43, and the substrate 10 is sufficiently high. The insulating layers 40, the insulating films 41, 42, and 43, and the substrate 10 have high etching resistance to phosphoric acid and remain without being etched.

Also, the blocking film 35 shown in FIG. 3 provided at the outermost circumference of the columnar unit CL is resistant to phosphoric acid; and the etching of the side surface of the columnar unit CL due to the phosphoric acid entering through the air gaps 44 is suppressed.

Further, the etching from the upper end side of the columnar unit CL also can be suppressed because the upper end of the columnar unit CL is covered with the insulating film 43.

The insulating layers 40 that are stacked with the air gaps 44 interposed are supported by the columnar unit CL. Also, the lower end of the columnar unit CL is supported by the substrate 10; and the upper end of the columnar unit CL is supported by the insulating films 42 and 43.

Figure 24:
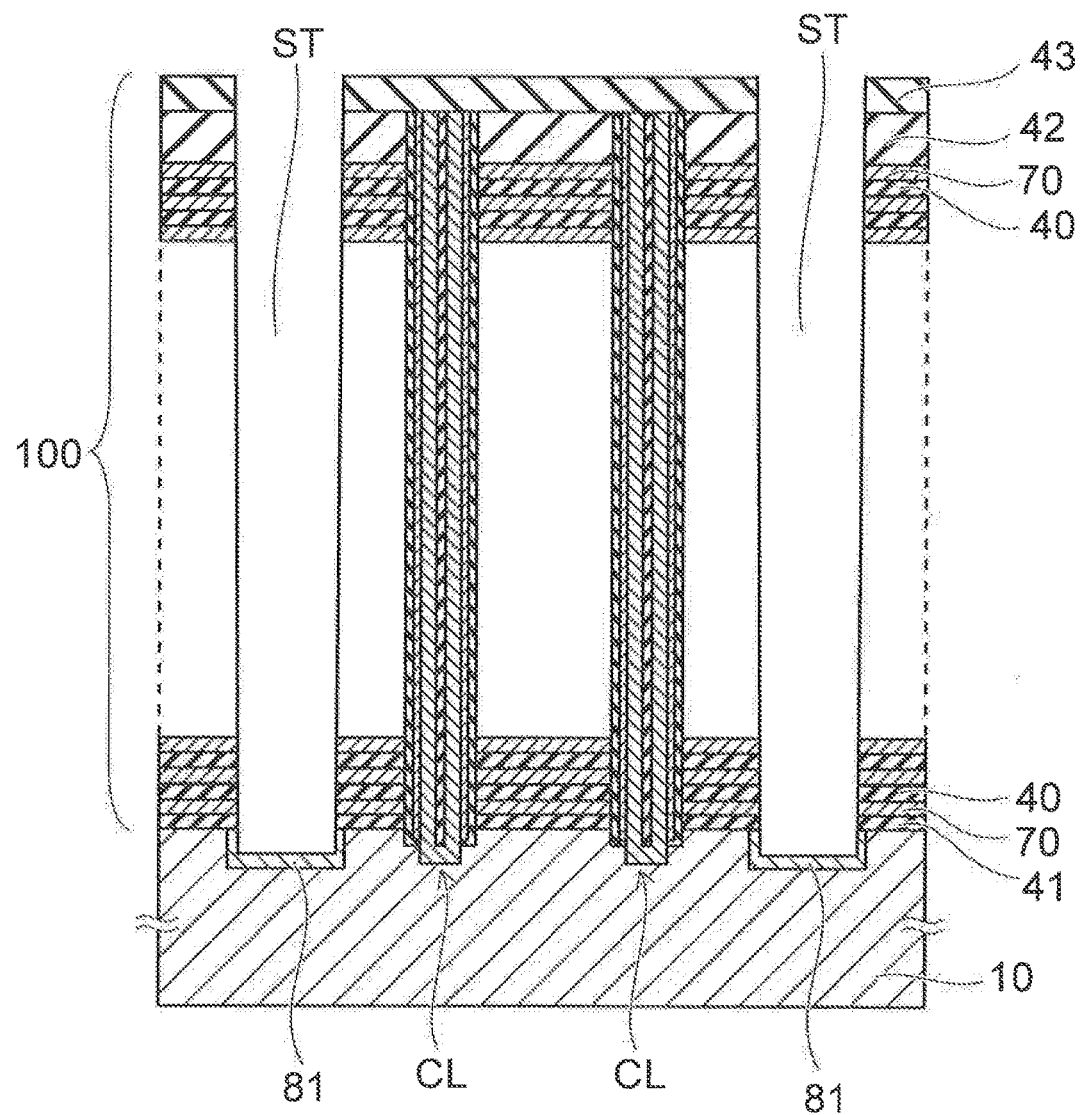

As shown in FIG. 24, the electrode layers 70 are formed in the air gaps 44 made by removing the sacrificial layers 71. For example, tungsten layers or molybdenum layers are formed by CVD as the electrode layers 70 with a barrier metal interposed.

The electrode layers 70 are formed between the insulating layers 40 adjacent to each other in the stacking direction, between the insulating film 41 and the insulating layer 40 of the lowermost layer, and between the insulating film 42 and the insulating layer 40 of the uppermost layer.

Figure 25:
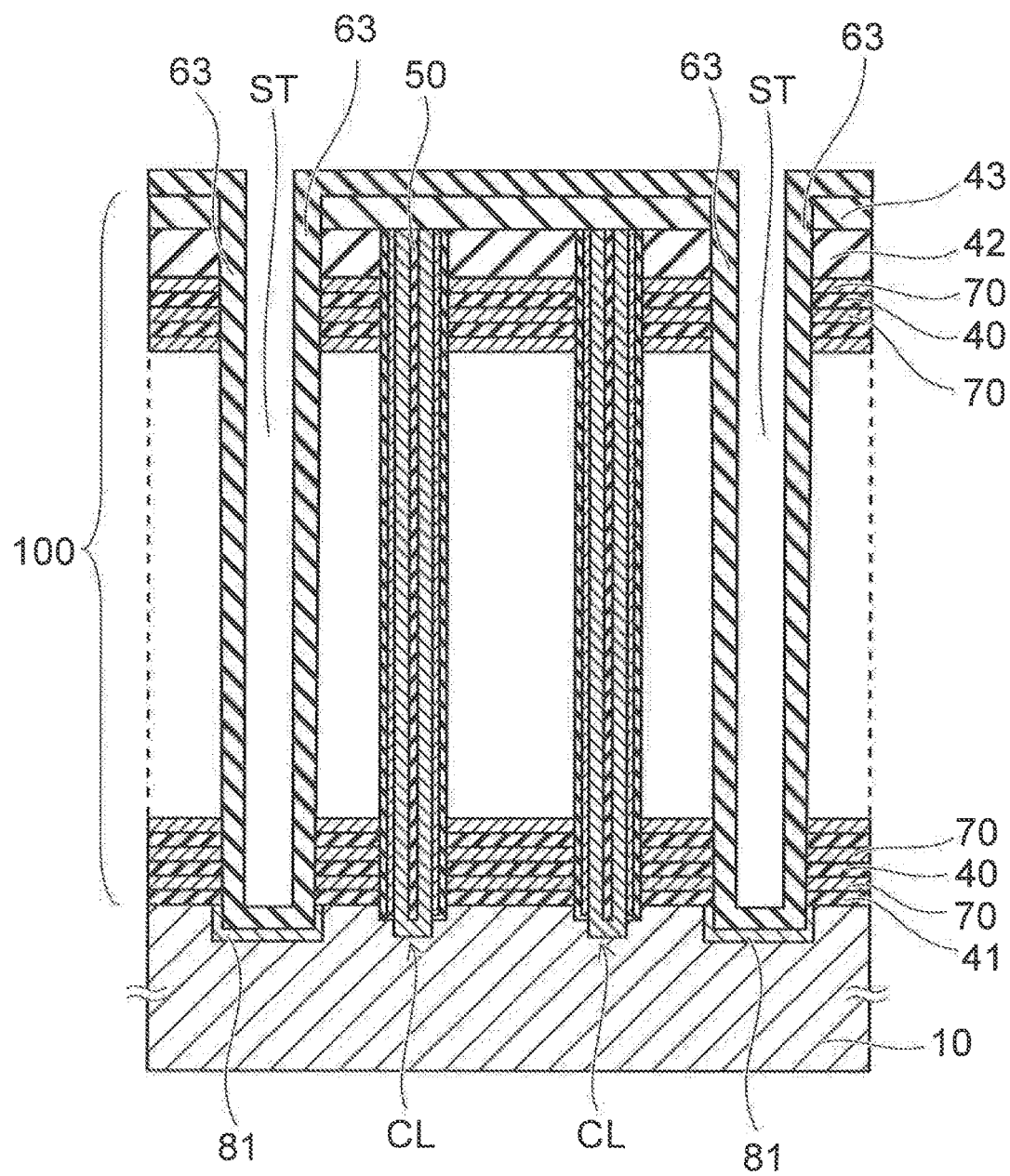

Subsequently, as shown in FIG. 25, the insulating film 63 is formed on the side surface and bottom of the slit ST. For example, after removing the insulating film 63 on the bottom of the slit ST by RIE, the interconnect unit LI shown in FIG. 2 is filled on the inner side of the insulating film 63 inside the slit ST.

According to the embodiment as described above, the fluctuation in the stacking direction of the inter-side surface distance between the sacrificial layers 71 opposing each other on either side of the central axis of the memory hole MH is relaxed. Accordingly, the fluctuation in the stacking direction of the inter-side surface distance between the electrode layers 70 opposing each other on either side of the columnar unit CL is relaxed. Therefore, the characteristics of the memory cells on the upper layer side and the characteristics of the memory cells on the lower layer side can be matched; and the setting of the operating voltage, etc., is easy.

Figure 26:
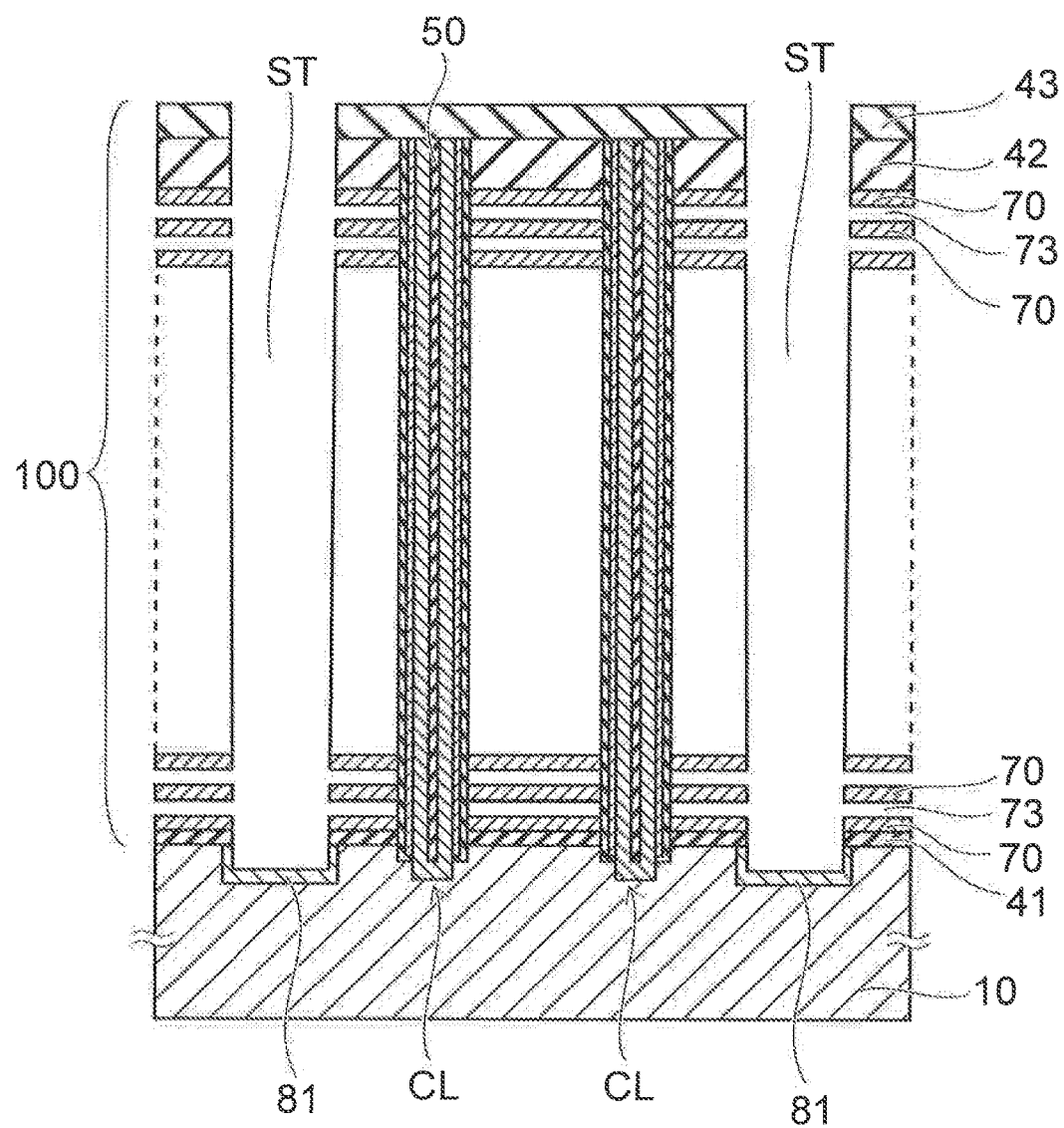

After the process of FIG. 24 described above, air gaps 73 may be made between the multiple electrode layers 70 as shown in FIG. 26 by removing the insulating layers 40.

The insulating layers 40 are removed by an etchant supplied through the slits ST. For example, the insulating layers 40 which are silicon oxide films are removed by an etchant containing hydrofluoric acid.

The etching selectivity of the insulating layers 40 with respect to the electrode layers 70, the Insulating films 41, 42, and 43, and the substrate 10 is sufficiently high. The electrode layers 70, the insulating films 41, 42, and 43, and the substrate 10 have high etching resistance to hydrofluoric acid and remain without being etched.

Also, the blocking film 35 that is provided at the outermost circumference of the columnar unit CL is resistant to hydrofluoric acid; and the etching of the side surface of the columnar unit CL by the hydrofluoric acid entering through the air gaps 73 is suppressed. Further, the etching from the upper end side of the columnar unit CL also can be suppressed because the upper end of the columnar unit CL is covered with the insulating film 43.

The interconnect capacitance between the electrode layers 70 can be reduced by the air gaps 73 between the electrode layers 70.

The electrode layers 70 that are stacked with the air gaps 73 interposed are supported by the columnar unit CL.

Also, the electrode layers 70 are not limited to being formed by replacing the sacrificial layers 71 and may be stacked on the substrate 10 prior to making the memory holes MH.

That is, as shown in FIG. 24, the insulating film 41 is formed on the substrate 10; and the electrode layers 70 and the insulating layers 40 are stacked alternately on the insulating film 41. In the stacked body 100, the memory holes MH and the columnar units CL are formed; and the slits ST and the interconnect units LI are further formed.

For example, tungsten layers or molybdenum layers are formed as the electrode layers 70. For the stacked body 100 including such electrode layers 70 as well, a carbon film can be used as the first sacrificial film 95 described above; and silicon oxide films can be used as the second sacrificial film 96 and the third sacrificial film 97. A gas containing oxygen can be used for the etching causing the first sacrificial film 95 to recede upward along the side surfaces of the memory holes MH; and a gas containing oxygen and fluorine can be used in the side etching causing the electrode layers 70 which are tungsten layers or molybdenum layers to recede in the diametrical direction of the memory holes MH.

The isotropic etching of the first sacrificial film 95 and the first layers (the sacrificial layers 71 or the electrode layers 70) is not limited to dry etching and may be wet etching.

Although an example is described in the embodiments described above in which processes that use the sacrificial films 95 to 97 and isotropic etching are applied to improve the tapered configuration of holes, the processes also are applicable to improve the tapered configuration of slits.

That is, the fluctuation of the width between the upper portions and the lower portions of the slits can be eliminated or relaxed by applying the processes utilizing the sacrificial films 95 to 97 and the isotropic etching recited above by replacing the memory holes MH shown in the cross-sectional views shown in FIG. 8 to FIG. 16 with slits extending into the page surface, and by further replacing the diameter of the memory holes MH with the width of the slits and replacing the diametrical direction of the memory holes MH with the width direction of the slits. For example, such an improvement of the tapered configurations of the slits also is applicable when making the slits ST shown in FIG. 22.

Also, although an example is described in the embodiments recited above in which the stacked body 100 including the mutually-different materials of the first layers (the sacrificial layers 71 or the electrode layers 70) and the second layers (the Insulating layers 40) repeatedly stacked alternately is used as the etching layer, the etching layer may be a single-layer film of the same type or a stacked film without a repeating structure. The embodiments described above are applicable to improve the configuration of holes or slits having high aspect ratios regardless of the material or structure of the etching layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
    forming a first sacrificial film on a side surface of a hole and on a bottom of the hole, the hole being made in an etching layer, a diameter of a lower portion of the hole made in a lower layer portion of the etching layer being smaller than a diameter of an upper portion of the hole made in an upper layer portion of the etching layer;
    forming a second sacrificial film to cover the first sacrificial film;
    exposing the first sacrificial film on the bottom by removing the second sacrificial film on the bottom;
    making a gap between the second sacrificial film and a side surface of the lower portion of the hole by causing etching of the first sacrificial film to progress along the side surface of the lower portion of the hole from the exposed portion on the bottom; and
    causing an end of at least one portion of the lower layer portion of the etching layer to recede in a diametrical direction of the hole by causing side etching to progress from an end of the lower layer portion of the etching layer exposed in the gap,
    the first sacrificial film and the second sacrificial film being formed also on an upper surface of the etching layer,
    the first sacrificial film on the upper surface of the etching layer being covered with a cover film, the cover film including the second sacrificial film, and
    a thickness of the cover film being thicker than a thickness of the second sacrificial film on the bottom.

2. The method for manufacturing the semiconductor device according to claim 1, wherein the cover film includes a third sacrificial film formed on the second sacrificial film.

3. The method for manufacturing the semiconductor device according to claim 1, wherein the cover film covers a corner from the upper surface of the etching layer to a side surface at an entrance vicinity of the hole.

4. The method for manufacturing the semiconductor device according to claim 1, wherein
    the etching of the first sacrificial film includes causing the gap to extend upward along the side surface of the lower portion of the hole;
    the causing of the end to recede in the diametrical direction of the hole includes performing the side etching of the lower layer portion of the etching layer exposed in the extended region of the gap; and
    the etching of the first sacrificial film and the causing of the end to recede are multiply repeated.

5. The method for manufacturing the semiconductor device according to claim 1, wherein
    the etching layer includes a plurality of first layers and a plurality of second layers stacked alternately one layer at a time, and
    the first layer on a lower layer side is used as the at least one portion of the lower layer portion of the etching layer, and an end of the first layer on the lower layer side is caused to recede in the diametrical direction of the hole by the side etching.

6. The method for manufacturing the semiconductor device according to claim 5, wherein the first layers are silicon nitride films, the second layers are silicon oxide films, the first sacrificial film is a carbon film, and the second sacrificial film is a silicon oxide film.

7. The method for manufacturing the semiconductor device according to claim 6, wherein the etching of the first sacrificial film is performed using a gas containing oxygen, and the side etching of the first layer is performed using a gas containing fluorine and oxygen.

8. The method for manufacturing the semiconductor device according to claim 5, wherein
    the etching of the first sacrificial film includes causing the gap to extend upward along the side surface of the lower portion of the hole, and spreading exposed ends of the first layers in the gap toward an upper layer side in order one layer at a time or multiple layers at a time from a lowermost first layer;

the causing of the end to recede in the diametrical direction of the hole includes performing the side etching of the spread exposed ends of the first layers; and the etching of the first sacrificial film and the causing of the end to recede are multiply repeated.

9. The method for manufacturing the semiconductor device according to claim 8, further comprising:

removing the first sacrificial film and the second sacrificial film remaining on the side surface of the hole after the causing of the ends of the first layers on the lower layer side to recede in the diametrical direction of the hole;

forming a stacked film on the side surface of the hole after removing the first sacrificial film and the second sacrificial film, the stacked film including a charge storage film; and forming a semiconductor film on a side surface of the stacked film.

10. The method for manufacturing the semiconductor device according to claim 9, further comprising:

making a slit piercing the plurality of first layers and the plurality of second layers after forming the stacked film and the semiconductor film; and replacing, through the slit, the plurality of first layers with a plurality of electrode layers.

11. The method for manufacturing the semiconductor device according to claim 10, further comprising making an air gap between the electrode layers by removing the second layers through the slit after replacing the first layers with the electrode layers.

12. The method for manufacturing the semiconductor device according to claim 5, wherein the first layers are metal layers containing tungsten or molybdenum, the second layers are silicon oxide films, the first sacrificial film is a carbon film, and the second sacrificial film is a silicon oxide film.

13. The method for manufacturing the semiconductor device according to claim 12, wherein the etching of the first sacrificial film is performed using a gas containing oxygen, and the side etching of the first layer is performed using a gas containing fluorine and oxygen.

14. A method for manufacturing a semiconductor device, comprising:

forming a first sacrificial film on a side surface of a slit and on a bottom of the slit, the slit being made in an etching layer, a width of a lower portion of the slit made in a lower layer portion of the etching layer being narrower than a width of an upper portion of the slit made in an upper layer portion of the etching layer;

forming a second sacrificial film to cover the first sacrificial film;

exposing the first sacrificial film on the bottom by removing the second sacrificial film on the bottom;

making a gap between the second sacrificial film and a side surface of the lower portion of the slit by causing etching of the first sacrificial film to progress along the side surface of the lower portion of the slit from the exposed portion on the bottom; and causing an end of at least one portion of the lower layer portion of the etching layer to recede in a width direction of the slit by causing side etching to progress from an end of the lower layer portion of the etching layer exposed in the gap, the first sacrificial film and the second sacrificial film being formed also on an upper surface of the etching layer, the first sacrificial film on the upper surface of the etching layer being covered with a cover film, the cover film including the second sacrificial film, and a thickness of the cover film being thicker than a thickness of the second sacrificial film on the bottom.

15. The method for manufacturing the semiconductor device according to claim 14, wherein the cover film includes a third sacrificial film formed on the second sacrificial film.

16. The method for manufacturing the semiconductor device according to claim 14, wherein the cover film covers a corner from the upper surface of the etching layer to a side surface at an entrance vicinity of the slit.

17. The method for manufacturing the semiconductor device according to claim 14, wherein the etching of the first sacrificial film includes causing the gap to extend upward along the side surface of the lower portion of the slit;

the causing of the end to recede in the width direction of the slit includes performing the side etching of the lower layer portion of the etching layer exposed in the extended region of the gap; and the etching of the first sacrificial film and the causing of the end to recede are multiply repeated.

18. The method for manufacturing the semiconductor device according to claim 14, wherein the etching layer includes a plurality of first layers and a plurality of second layers stacked alternately one layer at a time, and the first layer on a lower layer side is used as the at least one portion of the lower layer portion of the etching layer, and an end of the first layer on the lower layer side is caused to recede in the width direction of the slit by the side etching.

* * * * *